US008762095B2

(12) United States Patent
Van Wagenen et al.

(10) Patent No.: US 8,762,095 B2
(45) Date of Patent: Jun. 24, 2014

(54) SYSTEM FOR CONCURRENT TEST OF SEMICONDUCTOR DEVICES

(75) Inventors: Bethany Van Wagenen, Somerville, MA (US); Seng J. Edward, Brookline, MA (US)

(73) Assignee: Teradyne, Inc., North Reading, MA (US)

( * ) Notice: Subject to any disclaimer, the term of this patent is extended or adjusted under 35 U.S.C. 154(b) by 349 days.

(21) Appl. No.: 13/100,889

(22) Filed: May 4, 2011

(65) Prior Publication Data

US 2011/0275170 A1     Nov. 10, 2011

Related U.S. Application Data

(60) Provisional application No. 61/133,418, filed on May 5, 2010.

(51) Int. Cl.
  *G01R 27/28*     (2006.01)
  *G01R 31/00*     (2006.01)
  *G01R 31/14*     (2006.01)

(52) U.S. Cl.
  USPC ............................... 702/117; 702/119; 438/5

(58) Field of Classification Search
  USPC ............................................. 702/119; 438/5
  See application file for complete search history.

(56) References Cited

U.S. PATENT DOCUMENTS

| 7,010,451 B2 | 3/2006 | Dorough et al. |
| 7,162,386 B2 | 1/2007 | Dorough et al. |

| 2003/0163273 A1* | 8/2003 | Breger et al. ................. 702/120 |
| 2005/0234674 A1* | 10/2005 | Bundy et al. ................. 702/119 |
| 2008/0229162 A1 | 9/2008 | Hata et al. |

FOREIGN PATENT DOCUMENTS

KR       10-0824503       4/2008

OTHER PUBLICATIONS

International Search Report and Written Opinion for PCT/US2011/035212 mailed Nov. 7, 2011.

* cited by examiner

*Primary Examiner* — Daniel Whalen

(74) *Attorney, Agent, or Firm* — Wolf, Greenfield & Sacks, P.C.

(57) ABSTRACT

A tool to aid a test engineer in creating a concurrent test plan. The tool may quickly map test system resources to specific pins to satisfy the requirements of a concurrent test. The tool may project test time when such a mapping is possible. When a mapping is not possible, the tool may inform its user, including making suggestions of additional resources that could allow the test system to perform the test or suggestions for other variations in input parameters that would allow a mapping. The tool employs an assignment process in which groups of associated pins are identified, along with associated resource requirements for each group. Groups of test system resources that collectively fulfill a higher level requirement are identified and the assignment is made by mapping resource sets to resource groups, using ordering and matching heuristics to reduce processing time.

40 Claims, 15 Drawing Sheets

FIG. 14B

SYSTEM FOR CONCURRENT TEST OF SEMICONDUCTOR DEVICES

CROSS-REFERENCE TO RELATED APPLICATIONS

This application claims the benefit of provisional U.S. Patent Application No. 61/331,418, entitled SYSTEM FOR CONCURRENT TEST OF SEMICONDUCTOR DEVICES and filed May 5, 2010. The entirety of the aforementioned application is incorporated herein by reference.

BACKGROUND

1. Field of the Invention

This invention relates generally to the manufacture of semiconductor devices and more specifically to developing test programs for semiconductor devices.

2. Related Art

Semiconductor devices are generally tested at least once during their manufacture. Such tests are performed by an automated test system that can generate large numbers of stimulus signals and measure large numbers of response signals. The test system has multiple instruments that can generate various types of signals that may occur within a device under test as it operates. Similarly, the instruments can measure the various types of signals that may be generated by the device.

For example, many semiconductor devices are fabricated today as a "system on a chip" (SoC) or a "system in a package" (SiP) that contain sub-circuits, sometimes called "cores" or "functional blocks," that collectively perform multiple types of operation that may be performed by an electronic device. As a specific example, a chip that may be used in cellular telephone may have cores that send and receive radio frequency (RF) signals. Other cores may control the RF circuitry and yet another core may act as a general purpose processor that can be programmed to run applications. To fully test such an SoC or SiP device, a test system may have instruments that generate and measure RF signals and instruments that generate and measure digital signals such as may be processed within the control core and processor core. A test system will also have instruments that can generate and measure other signals of the types that may occur within an operating semiconductor device, such as voltage and current signals of the type that may be applied by a power supply during device operation, or signal that may be read from a sensor. These instruments collectively provide resources for performing tests.

As devices have gotten more complex, the complexity of test systems required to test the devices has increased. Additionally, more time is required to create test plans and to perform the tests, creating a concern for device manufacturers over the cost of test. One way in which this concern is addressed is through the use of concurrent test processes. A test process may be made concurrent for a particular device by testing multiple cores, or other regions of the device, in parallel. Separate tests or groups of tests, which are sometimes called test blocks, may be developed for each of these regions. For such testing to be effective, execution of one test block should not affect operation of any other part of a device that is being concurrently tested by another test block. Accordingly, a difficulty in making a concurrent test plan is identifying an appropriate test "flow" in which all test blocks are eventually executed, but that includes appropriate test blocks being executed together to save more test time.

A further difficulty in making a current test plan is ensuring that the test system to conduct the test has enough resources to generate and measure all of the signals required for all the test points concurrently being used for a test. Each location of a device at which a test signal is to be applied or measured is sometimes called a "pin." One aspect of making a concurrent plan is ensuring that the test system has enough instruments to provide the required resources at each pin involved in a test. Frequently, instruments are sold separately from test systems such that the test system can be configured for testing a specific device by installing instruments to provide required resources. As more test blocks are tested concurrently, more instruments may be required. In making a concurrent test plan, a tradeoff may be made between the number of blocks tested concurrently and the number of instruments in the test system configuration.

Another consideration in establishing a concurrent test plan is ensuring that signals from the instruments inside the test system are routed to a pin. In many test systems, this routing between pins and instruments is performed with a device interface board (DIB), which may be specially designed for each type of device to be tested. A test system has a predefined number of access points, each of which may be referred to as a channel. Each channel may act as an input, an output or both for one signal for one instrument. The DIB routes each channel to a point at which it is aligned with a mechanism to make a connection to a specific test point on the device under test.

A test system may have hundreds or thousands of channels, depending on the number of instruments installed in the test system. A device under test may have fewer pins than there are channels in a test system. Accordingly, a test process may also be made concurrent by testing multiple devices in parallel. In this case, multiple "sites" may be defined, with each site providing connections to one of the devices under test. The same test program may be run in parallel on each of the sites, effectively duplicating the pins of the device under test in each test site, with a corresponding duplication of required test resources.

For this concurrency to work, the DIB must be designed to connect channels to the sites such that at every step during a test flow an appropriate instrument is coupled to the each site to generate or measure a signal required on all pins in each site at that step in the test flow. As the number of pins and the number of types of signals that need to be generated and measured has increased, the time and complexity of designing a DIB has also increased. Though some tools are available to aid in this process, much of the design is still done manually by a test engineer figuring out how to assign test system channels to pins. In addition to the cost of the DIB design, the cost of delay for the device manufacturer can also be significant, because development of a test configuration can delay production of a device.

SUMMARY

The present disclosure relates to an automated tool for use in forming a concurrent test plan.

In one aspect, the invention relates to a method of generating information for a concurrent test plan for a device having a plurality of pins and to be performed by a test system having a plurality of resources. The method comprises identifying a plurality of groups of pins and a set of resource requirements during a concurrent test flow for each of the groups; identifying a plurality of sets of test system resources, the plurality of sets comprising one or more sets of test system resources that each collectively meets a requirement; and matching sets of the plurality of sets to respective groups of the plurality of groups.

Such a method may be executed with at least one processor of a computing device. Though, aspects of the invention may be embodied as a system, a method, a computer readable medium or a method of manufacturing semiconductor devices.

In a further aspect, the invention relates to a method of operating a computing device to generate information for a plan for concurrent test of at least one device, each of the at least one devices having a plurality of pins, and the test being performed by a test system having a plurality of resources connectable to the plurality of pins, the concurrent test comprising a plurality of blocks. The method includes iteratively performing processing that includes identifying a candidate flow in accordance with a heuristic, the candidate flow scheduling blocks to avoid previously identified conflicts between blocks. For each candidate flow, an attempt is made to allocate resources of the plurality of resources to pins of the plurality of pins to execute the concurrent test according to the candidate flow. When the attempt to allocate results in a successful allocation of resources, the test time for executing the concurrent test using the candidate flow is computed. When an allocation of resources is not successful because of a conflict between test blocks, the conflict between conflicting test blocks is recorded so that candidate flows in subsequent iterations do not include the conflict.

In yet a further aspect, the invention relates to at least one computer-readable storage medium comprising a plurality of computer-executable instructions that, when executed by at least one processor, implement a tool for generating information for a plan for concurrent test of at least one device, each of the at least one devices having a plurality of pins, and the test being performed by a test system having a plurality of resources connectable to the plurality of pins, the concurrent test comprising a plurality of blocks. The computer-executable instructions make up a plurality of modules, plurality of modules comprising at least two modules, which may be two or more modules. A first possible module may, in response to input designating a first technique, identify at least one flow for concurrent test by enumerating candidate flows; attempt to allocate resources of the plurality of resources to pins of the plurality of pins to execute the concurrent test according to each of the enumerated candidate flows; and provide an output indicating a plurality of the enumerated candidate flows for which the allocation of resources is successful and a respective estimated test time for the enumerated candidate flow. A second module may, in response to input designating a second technique, identifying at least one flow for concurrent test by iteratively generating, until a first termination condition is reached, a plurality of candidate flows by randomly generating, in each iteration, a candidate flow that has characteristics indicated by a heuristic to execute the concurrent test in a time shorter than a test time for a prior candidate flow computed during a prior iteration. For each iteration, the second module may, for each generated candidate flow, attempt to allocate resources of the plurality of resources to pins of the plurality of pins to execute the concurrent test according to each of the enumerated candidate flows. The second module may provide an output indicating at least one of the generated candidate flows for which the allocation of resources is successful. A third module, in response to input designating a third technique, may identify at least one flow for concurrent test by iteratively generating, until a second termination condition is reached, a plurality of candidate flows by generating, in each iteration, a candidate flow that has characteristics indicated by a heuristic to execute the concurrent test in a time longer than a test time for a prior candidate flow computed during a prior iteration. The third module may also, for each generated candidate flow, attempt to allocate resources of the plurality of resources to pins of the plurality of pins to execute the concurrent test according to each of the enumerated candidate flows. Output of the third module may indicate at least one of the generated candidate flows for which the allocation of resources is successful.

In yet a further aspect, the invention may relate to at least one computer-readable storage medium comprising a plurality of computer-executable instructions that, when executed by at least one processor, implement a tool for generating information for a plan for concurrent test of at least one device, each of the at least one devices having a plurality of pins, and the test being performed by a test system having a plurality of resources connectable to the plurality of pins, the concurrent test comprising a plurality of blocks. The computer-executable instructions may receive input specifying a test system configuration; receive input specifying a candidate flow; and determine whether resources of the plurality of resources can be successfully allocated to pins of the plurality of pins to execute the concurrent test according to the input candidate flow with the specified test system configuration.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIGS. 14A and 14B are sketches of further exemplary user interfaces through which a user may input information used by a tool according to some embodiments of the invention.

DETAILED DESCRIPTION

Figure 1:
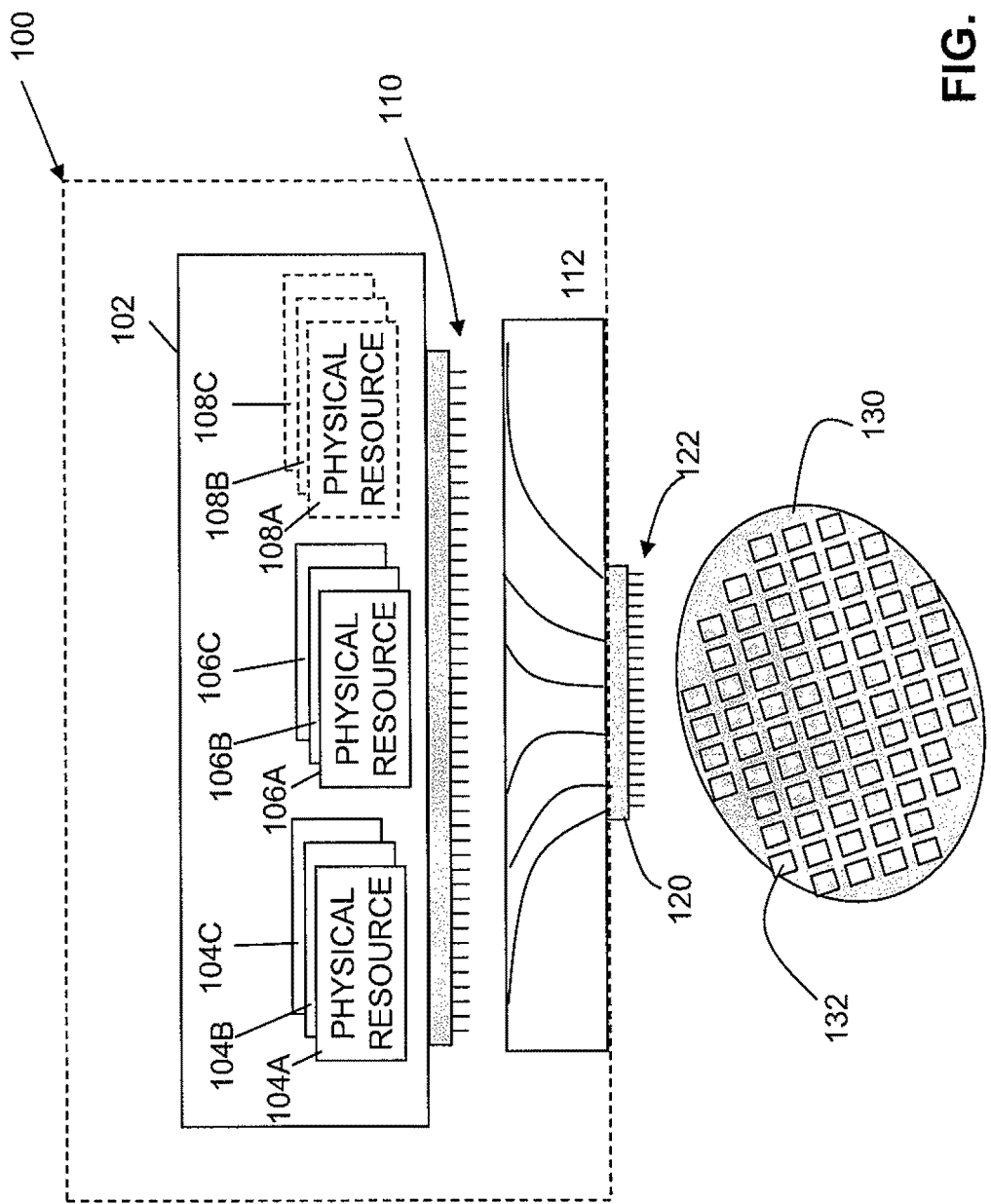
FIG. 1 is a schematic illustration of a test system that may be used in the manufacture of semi-conductor devices using a concurrent test plan developed using a tool according to some embodiments of the invention.

The inventors have recognized and appreciated that an automated tool for mapping tester channels to pins can speed development of a concurrent test plan and may yield a more cost effective concurrent test plan. By having a tool that can quickly make an efficient assignment, values of multiple parameters in the concurrent test plan can be varied to search for a plan that makes appropriate tradeoffs between test time and test equipment costs. Use of the tool may lead to identification of a test system configuration, test flow and channel assignments that provide a desired tradeoff between time and cost for testing a particular device.

Such a tool may address challenges associated with identifying concurrent flows that can be achieved for particular testing scenarios. The tool, for example, may aid a user in identifying device-enabled flows by identifying blocks that are fully independent from each other or, conversely, conflicting blocks that cannot be tested concurrently. "Fully independent" implies that blocks do not share pins or internal resources. Alternatively or additionally, a tool may aid a user in identifying tester-enabled flows. A flow may be tester-enabled when a test system contains sufficient resources that are fully independent and can run concurrently such that resources can be assigned to execute a test program in accordance with the flow.

In operation of the tool, the values of the parameters of the concurrent test plan may be varied iteratively. These iterations may be performed automatically by the tool. Though, in some embodiments, the tool can identify an appropriate assignment between test system channels and test pins quickly enough that it may be used iteratively by a test engineer. Accordingly, the tool may include a user interface through which a test engineer may input parameter values and receive information on concurrent test plans that allow the test engineer to select a concurrent test plan. In addition to providing a test engineer with information on performance of a concurrent test plan when an appropriate mapping between channels and pins is found, if the tool cannot identify an appropriate mapping, the tool may provide the test engineer with information about parameters of the concurrent test plan that could be varied to increase the likelihood that a mapping can be found. For example, the tool may indicate additional instruments that could be added to a test system in order to achieve an appropriate mapping or may provide feedback on the number of test sites that can be supported for concurrent testing based on a specific test system configuration. In this way, the test engineer may use the tool to quickly identify a concurrent test plan that reflects a desired tradeoff between test time and equipment cost.

An aspect of such a tool is an approach for quickly identifying an appropriate mapping between channels and pins or, if a mapping is not possible, quickly identifying that fact. Such quick execution may allow iterative use of the tool under which a user may determine a test time, or other characteristics of test execution, under certain specified test configurations. If the user is dissatisfied with those characteristics of test execution, the user may specify a different test configuration and determine the effect on test characteristics.

A tool may make a mapping between pins and channels by applying rules and associations to identify requirements for groups of pins. The groups of pins and the associated requirements may be regarded as defining "resource engine requirements." The tool may also identify sets of test resources that can fulfill possible requirements. The sets of test system resources may be regarded as defining "resource engines." The tool may search for a workable mapping between resource engine requirements and resource engines. Searching for mappings between "resource engine requirements" and "resource engines" may be computationally more efficient than searching for matching between individual pins and resources.

The tool may use ordering techniques to increase the likelihood that an efficient assignment is quickly identified. For example, possible test flows may be ordered based on a projected test time that would be achieved if the flow can be implemented. The tool may test whether it can find a workable assignment for flows in order of fastest to slowest. Once a desired number of workable options is identified, the tool may end its analysis of further flows. As another example, the tool may order resource engine requirements based on a frequency of occurrence of resource engines to fulfill such the requirements or other indicator of a difficulty in finding a mapping that satisfies the requirement. The tool may construct mappings by preferentially assigning resource engines to fulfill more difficult requirements.

FIG. 1 illustrates an environment in which some embodiments of the invention may operate. FIG. 1 illustrates a test system 100 that may be programmed to perform concurrent tests based on use of a tool as described herein. In the environment illustrated in FIG. 1, test system 100 is adapted for testing a wafer 130, which may be a wafer of known type. Wafer 130 may contain multiple semi-conductor dies of which die 132 is numbered. Frequently, all of the dies on a wafer will have the same design such that numerous dies may be made on a single wafer as common processing steps are performed during manufacture of wafer 130.

The example of FIG. 1 illustrates a test scenario in which the test system is run at a stage of a manufacturing operation sometimes called "probe," in which the devices are tested while still part of a wafer. Semiconductor devices may be tested at other stages of the manufacturing operation, including as part of a final test once devices are packages. Accordingly, it should be appreciated that the techniques described herein are not limited by the stage of manufacture at which they are applied.

Test system 100 includes multiple instruments that can generate and measure test signals. The specific types of instruments included within test system 100 may depend on the nature of the semi-conductor devices for which test system 100 is configured to test. For example, some instruments may generate or measure digital test signals while others may generate and measure RF signals. However, the specific type of instruments installed within test system 100 is not critical to the invention.

In FIG. 1, a collection of instruments 102 is illustrated as providing multiple physical resources, each of which may be used to generate or measure a test signal during a test. In the example, of FIG. 1, physical resources 104A, 104B and 104C are illustrated. These physical resources, for example, may represent instruments capable of generating or measuring an analog signal. Similarly, physical resources 106A, 106B and 106C are illustrated. These resources may represent instruments that can generate or measure digital test signals, for example.

It should be recognized that FIG. 1 provides a simplistic illustration of a test system and that many more than six physical resources may be provided by instruments 102 within test system 100. It should also be recognized that test system 100 may be constructed with a modular architecture such that the number of instruments may be increased or decreased by appropriately configuring the test system. Here, FIG. 1 illustrates that test system 100 includes slots to receive further instruments to provide additional instruments to provide physical resources 108A, 108B and 108C. According to some embodiments of the invention, one aspect of determining a concurrent test plan is to determine a desired collection of instruments to provide a desired collection of physical resources in test system 100 to perform concurrent testing.

Regardless of the number of instruments within test system 100, for testing semi-conductor devices, test signals must be coupled between the physical resources and the semi-conductor device under test. In the example illustrated, test system 100 includes an interface in which multiple contact points are exposed. In this example, the contact points form channels 110. Each of the channels may be coupled to a physical resource 104A . . . 104C or 106A . . . 106C.

Some or all of the channels 110 may be assigned to generate and receive signals at test points on a device under test. The mapping between channels, which are associated with physical resources, and test points on a device under test may be established through use of a tool as described below. Once this mapping is established, it may be implemented through an interface structure, illustrated as device interface board (DIB) 112. DIB 112 may include an upper surface adapted to make contact with the channels 110. A lower surface of DIB 112 may contain probe needles 122 or other structures adapted to make electrical connection to a device under test.

Each of the probe needles 122 may be positioned to contact a device under test at a test point associated with a test "pin." The mapping between test system resources and the pins may be implemented within DIB 112 by electrical connections between the probe needles 122 and channels 110. A tool as described herein may be used to aid a test engineer or other user identify an appropriate mapping such that DIB 112 can be designed to support testing according to a test plan.

A test plan may specify concurrent testing of wafer 130. Concurrent testing may be performed on multiple dies on wafer 130. However, the number of test points per die and the number of dies per wafer frequently makes it impractical to concurrently generate and measure all of the test signals that would be required to test all of the dies on wafer 130 concurrently. Rather, test system 100 may be configured to test a subset of the dies on wafer 130 concurrently. During a testing operation, a device (not illustrated in FIG. 1) for handling wafer 130 may move wafer 130 to successively position groups of dies on wafer 130 for concurrent testing by test system 100. Each die connected to the test system concurrently is connected through a multiple test pins that are sometimes collectively referred to as a "site."

The number of sites that can be concurrently tested depends on multiple factors. In a like fashion, the number of test blocks that may be executed concurrently depends on multiple factors. The nature of the device under test as well as the physical resources available within test system 100 may impact the amount of concurrency that may be achieved. Additionally, the efficiency of the mapping between physical resources within test system 100 and test points on the device under test may also impact that amount of concurrency possible.

Though FIG. 1 illustrates a relatively few types of physical resources, such as physical resources 104A . . . 104C and physical resource 106A . . . 106C, a test system for testing sophisticated SOC and SIP devices may have numerous types of resources. Therefore, it is not adequate to map a test pin to any resource. Rather, a successful mapping associates with each test pin a resource that can generate or measure the types of signals that need to be generated or measured at that test pin in order to successfully test the device under test. Identifying a mapping that efficiently utilizes test system resources may be complicated both because of the large number of test system resources and the possibility that some test system resources may satisfy different types of requirements. If multiple types of test system resources may be used to satisfy the requirements of a specific test pin, the resource selected for that pin may impact the availability of test system resources to satisfy requirements for other test pins. Accordingly, choices as to which test system resource will be mapped to specific test pins may impact the overall number of test pins that can be associated with appropriate resources.

In planning a concurrent test process, an inability to assign a test system resource to a test pin for a site might be dealt with by finding a different mapping between resources and other test pins such that resources are provided for all of the test pins. A test engineer may select this approach, for example, if the test system is configured with a sufficient number of resources, capable of operating independently, to assign to each pin that requires a signal to be independently generated or measured. Alternatively or additionally, the number of test system resources may be increased, such as by adding more instruments to test system 100. As a further possibility, the number of test pins for which test signals must be concurrently generated or measured may be reduced. Adding more test system resources entails increasing capital cost. Decreasing concurrency reduces the rate at which devices may be tested, which indirectly impacts cost of test. Therefore, it may be desirable to find a mapping between test system resources and test pins that supports a flow with a high level of concurrency during testing to efficiently using test system resources.

Figure 2:
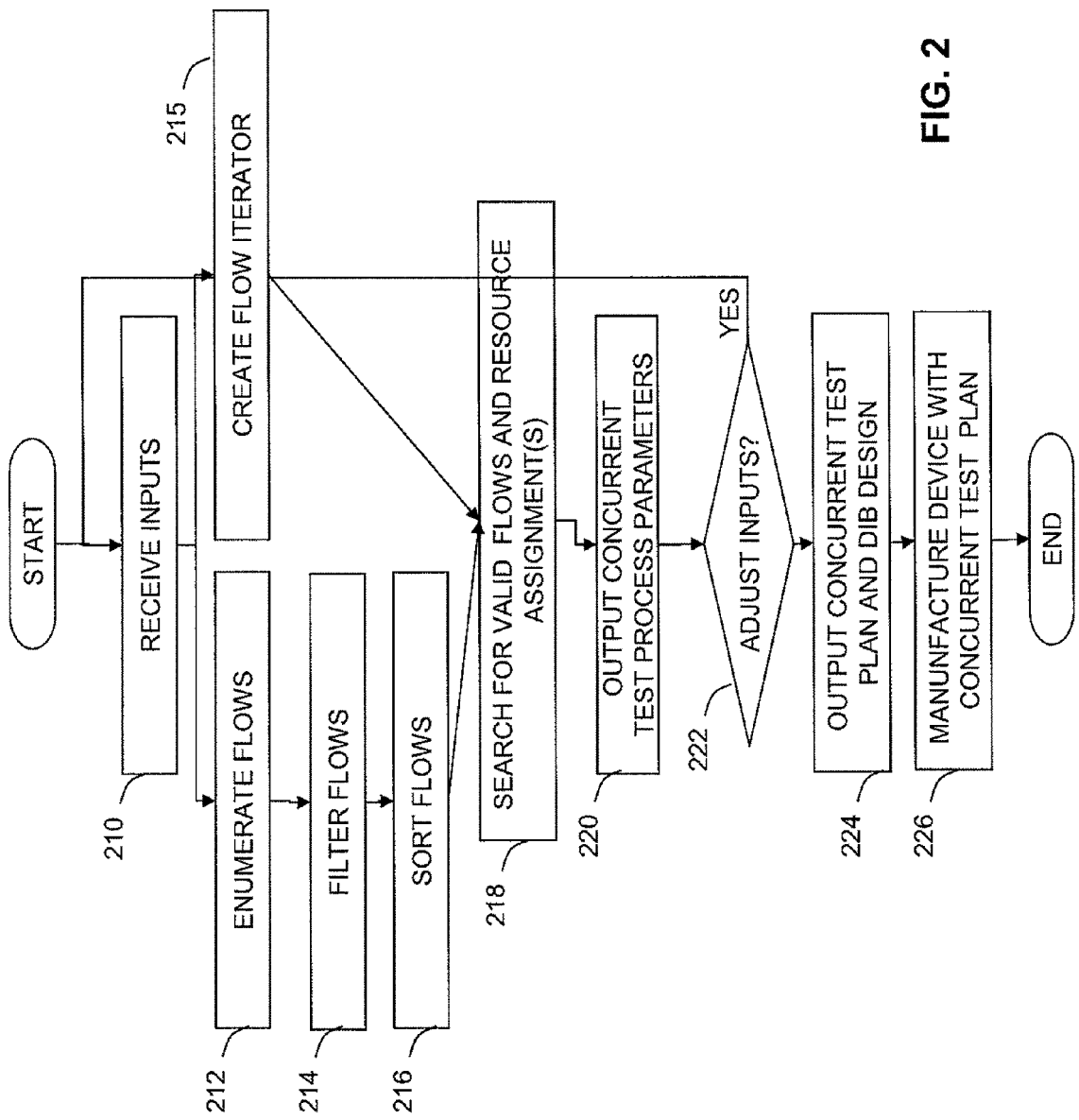
FIG. 2 is a high level flow chart of a method of operation of a tool for developing a concurrent test plan according to some embodiments of the invention.

FIG. 2 illustrates a process of developing an efficient mapping between test system resources and test pins to support concurrent testing. Whether a mapping is feasible for a device and test may depend on a flow being used and/or a test system configuration, such as number of sites being tested concurrently, or other parameters. Accordingly, instead of or in addition to identifying a resource mapping, output of the tool may alternatively or additionally include an identification of one or more flows that may be used for testing a device and/or information about a test system configuration or other parameters.

More generally, the tool may operate to determine whether, for a set of parameters, a mapping can be identified. The tool may operate to receive as inputs values for some of these parameters. The tool may then search for values of the other parameters that allow a resource mapping to be achieved. This searching may be subject to one or more constraints, some or all of which may be provided as inputs to the tool.

The process illustrated in FIG. 2 may be implemented as a tool executing on a computer system. Such a tool may be implemented to be interactive, allowing a test engineer to generate information with the tool that is useful during the design of a current test process. Though, in some embodiments, inputs may be obtained in an automated or semi-automated fashion and outputs may be applied to control a concurrent test process, also in an automated or semi-automated fashion.

In some embodiments, the tool may support multiple operating modes. For example, the tool may support receiving as inputs values of parameters, such as available resources and a test system configuration. Based on these inputs, the tool may identify a test flow, and corresponding resource mapping, that allows a specified test for a specified device to be performed with the test system. In this scenario, the output of the tool may be the resource mapping and an indication that a test flow could be found. Alternatively or additionally, an estimated test time might be output. In scenarios in which no resource mapping could be found, the output may indicate that negative result along with other information that may be useful to a test engineer, such as resources that would have to be added to the test system in order to find a resource mapping.

In some embodiments, rather than identifying candidate test flows, the tool may accept as an input a candidate test flow. The tool may then determine whether a resource routing can be found for that candidate flow. If so, the tool may output information, such as the resource mapping, estimated test time or values of other parameters. As another example of an operating mode, the tool may support "reverse-checking" a set of resource assignments to pins against one or more concurrent test flows. For "reverse-checking," the user already has a device interface board (DM) and channelmap and wants to see if any concurrent flows are enabled by this channelmap.

FIG. 2 illustrates an embodiment in which the tool is used to identify a flow and resource mapping for a specified test system configuration. In this example, the process performed by the tool may begin at block 210. At block 210, inputs may be received. Such inputs may be received from a test engineer or other user of the tool. Alternatively or additionally, such inputs may be received in an automated or semi-automated fashion from other computerized tools used in designing a semi-conductor device and generating a test program to test it.

These inputs may indicate a configuration of a test system on which a test may be executed. This configuration may correspond to physical hardware, already in place to perform a test, or may describe theoretical hardware to determine needs or benefits of acquiring additional instruments or other components for a test system.

Figure 3:
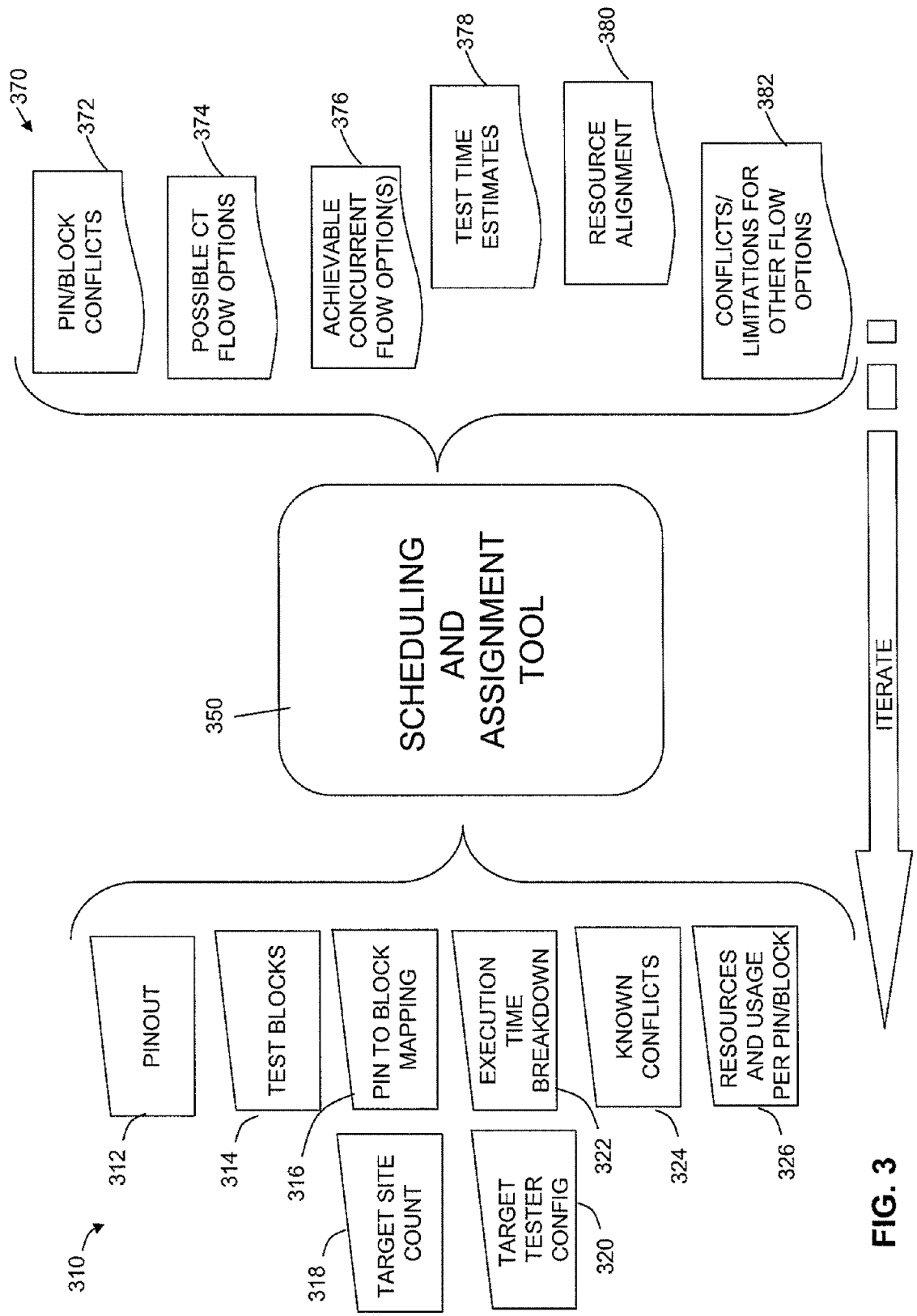
FIG. 3 is a schematic illustration of inputs and outputs to a tool useful in developing a concurrent test plan according to some embodiments of the invention.

FIG. 3 illustrates a collection of inputs 310 that are representative of the types of inputs that may be provided to a scheduling and assignment tool 350 performing the process of FIG. 2. Inputs 310 may provide the tool 350 with information about the device under test, the test system to perform the test or about the test itself. In embodiments in which concurrency is desired based on testing multiple sites in parallel, inputs relating to parameters that define a device under test or a test program may be provided for a single die, such as die 132, or other device to be tested at a site. Accordingly, input 312, representing a pinout, may represent the pinout of a single device to be tested, such as die 132. Input 312 may define pins to which resources may ultimately be mapped by operation of tool 350.

Input 314 may identify test blocks in a test program that has been created for a device to be tested. Each of the test blocks defines a separable portion of the test program that can be scheduled for execution as part of a concurrent test plan. Tool 350 may use input 314 to schedule execution of the test blocks such that some test blocks are executed concurrently.

Input 316 may provide a pin to block mapping. This information may identify which of the pins, as defined in input 312, are used during execution of each of the test blocks, as defined by input 314. In some scenarios, a single pin may be associated with multiple test blocks. Therefore, input 316 may identify multiple test blocks for each pin. However, the specific format of input 314, or any of the other inputs 310, is not critical to the invention.

Input 322 may provide further information about the test program. In this example, input 322 includes for each of the test blocks an estimate of the execution time of the test block. This information may be used by tool 350 to estimate overall execution time of a test according to a concurrent test plan, such that an efficient, concurrent test plan may be generated.

Input 324 may identify known conflicts that may preclude finding a workable mapping between test system resources and pins for certain test flows or assignments of resources to pins. More generally, one or more inputs may be used to characterize candidate flows to be considered, or not considered, by the tool. For example, input 324 may identify blocks that should not appear concurrently in the candidate flow. This input may be specified based on the device under test because the tests blocks require inputs to be input or output concurrently on the same device pins. Alternatively or additionally, this input may be specified based on the test system configuration. For example, if two blocks collectively require more resources than available in a test system, flows that test those blocks currently may not be considered by the tool.

Input 324, or any other suitable input, may be used by tool 350 to control the order in which candidate test flows are considered or candidate resource assignments to pins are considered. These inputs may be used to control the size of the problem that the tool attempts to solve. For example, in some embodiments, based on an input, the tool may attempt to generate every possible unique combination of test blocks. In this scenario, the tool may attempt to determine whether a resource mapping can be identified for a test flow having every block executed currently in a single flow step. The tool may also attempt to determine whether a resource mapping can be identified for a test flow having every block executed sequentially, in a number of flow steps equal to the number of test blocks. The tool may also attempt to determine whether a resource mapping can be identified for intermediate numbers of flow steps, with every possible combination of test blocks at each flow step that yields a unique test flow.

Though, other input values may specify other operating modes in which different techniques are used to generate a smaller number of candidate flows. Flows may be generated according to a heuristic that provides a high likelihood that flows, which will execute quickly and for which a resource mapping can be found, will be identified in a limited time. Such heuristics, for example, may generate candidate flows in an order from most concurrent, and therefore likely to be fastest, to least concurrent. Alternatively, an iterative approach may be used in which candidate flows are generated randomly, but only considered if more concurrent, and therefore likely to faster, than a prior candidate flow for which a successful resource mapping was identified. Regardless of the technique used to generate candidate test flows, inputs may limit the number or nature of candidate test flows generated.

Input 326 may contain information identifying resources required during a test. This information may be specified for any suitable element in the test process. As an example, a resource requirement may be specified for a pin or for a test block. Information included in input 326 may identify the aggregate resource usage for each pin in each test block.

Some pins, for example, may require different types of resources connected for a test block. As a specific example, during one step of a test, a leakage current may be measured at a pin. During a subsequent step of the test, a digital signal may be applied to the same pin. Accordingly, that pin may require resources that both generate a digital signal and can measure current.

Though, other requirements may also be specified as part of input 326. For example, information identifying a group of pins that operate together, and therefore must be supplied with resources that also operate together, may be input. As a specific example, a collection of pins may form a bus that, during a test, is to be clocked with a common timing.

Other inputs may define characteristics of a desired test plan generated to by tool 350. Input 318, for example, may define a desired number of sites to be tested concurrently. Tool 350 may use this input to determine the total number of pins for which resource assignments are to be made.

Input 320 may identify a tester configuration for which the concurrent test plan developed through tool 350 is to be executed. This configuration may specify, among other things, the number and types of resources in the test system. Tool 350 may use input 320 to identify resources available to be matched to pins.

It should be appreciated that FIG. 3 is illustrative of the types of inputs that may be provided to tool, and that in some embodiments, different or additional inputs may be provided. Regardless of the specific inputs received at block 210 (FIG. 2), these inputs may be used in a process in which candidate test plans are generated until one or more candidate test plans for which valid resource mappings can be made are identified. In accordance with some embodiments, candidate concurrent test plans are generated and checked for a valid resource assignment in an order that quickly leads to identification of a valid resource assignment or, if no valid assignment is possible, a rapid identification of this fact such that other candidate concurrent test plans may be tested.

Figure 4:
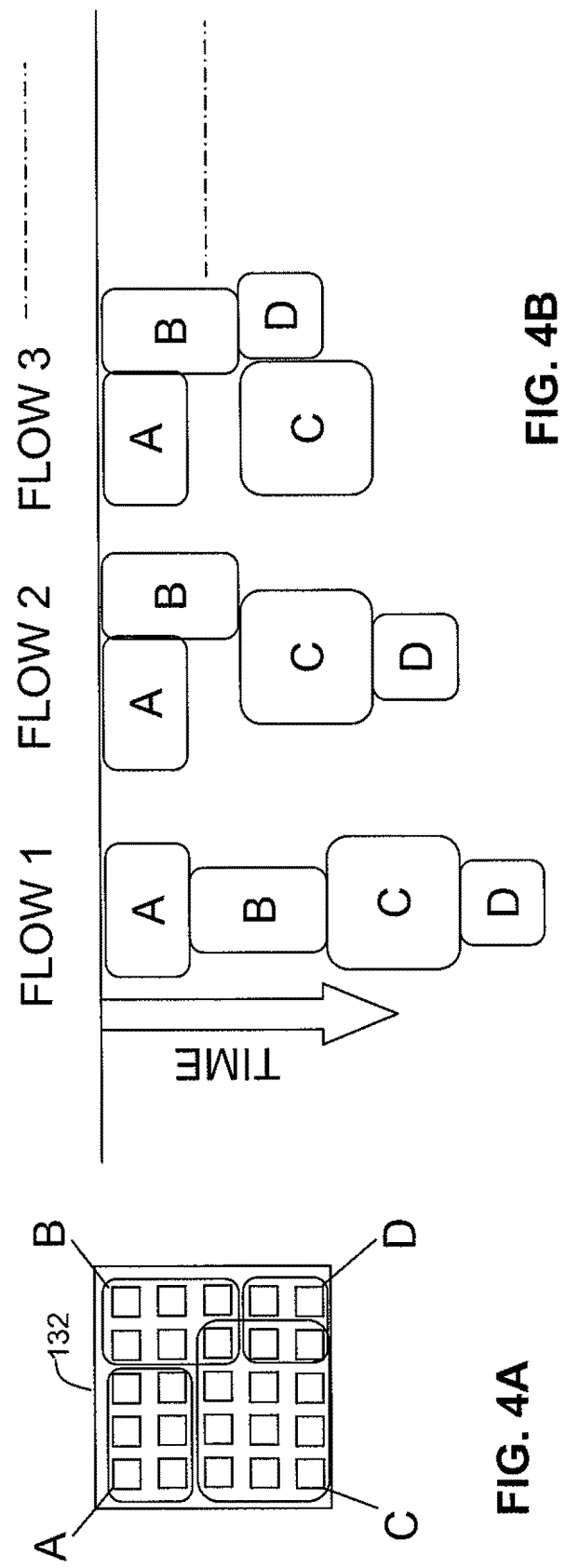
FIG. 4A is a schematic illustration of a semi-conductor device with test blocks for which a concurrent test program may be developed according to some embodiments of the invention.
FIG. 4B is a schematic illustration of enumeration of test flows for the semi-conductor device of FIG. 4A.

Returning to FIG. 2, the process for generating candidate test plans may proceed in one of multiple ways. In the example of FIG. 2, two options are illustrated, and the specific option selected depends on user inputs. A first option, involving generating a complete set of candidate flows is illustrated beginning at block 212. At block 212 possible test flows are enumerated. In some embodiments all possible test flows may be generated and then sorted. (This approach may be used when the number of combinations is a small enough set for a computer to manage.) FIGS. 4A and 4B illustrate enumeration of candidate test flows. As is known in the art, a device such as die 132 may have multiple sections that may be tested using separate test blocks. In the simplistic example of FIG. 4A, test blocks A, B, C and D are illustrated. Each of the test blocks may be associated with a portion of device 132. Generally, each test block is generated to test a portion of die 132 that performs a recognizable function. However, the specific manner in which test blocks are generated is not critical to the invention.

The test blocks provide for the possibility of concurrent testing of multiple portions of die 132. When separate portions of die 132 can be tested concurrently, without operations performed in one block interfering with operations performed in another test blocks, those blocks potentially can be executed concurrently provided that a valid assignment of resources can be identified to support such concurrent execution. A "flow" for a concurrent test indicates which of the test blocks are executed concurrently and which are executed sequentially.

FIG. 4B illustrates candidate flows that may be generated based on the test blocks in FIG. 4A. FLOW 1 illustrates sequential execution of test blocks A, B, C, and D. In contrast, FLOW 2 illustrates concurrent execution of test blocks A and B, followed by sequential execution of test blocks C, then D. FLOW 3 is yet another candidate flow, illustrating concurrent execution of test blocks A and B, followed by concurrent execution of test blocks C and D. Though not illustrated in FIG. 4B, other flows are possible and could be generated by forming different groupings of concurrent test blocks and different numbers of test blocks executed concurrently.

The candidate flows may be enumerated at block 212 (FIG. 2) in any suitable way. Known techniques for generating combinations of a finite number of elements may be used in enumerating candidate flows. Once enumerated, the candidate flows may be recorded in computer memory for further use in the process of FIG. 2.

Once the candidate flows are enumerated, the process may continue to block 214 where the candidate flows are filtered to remove from the set of candidate flows generated at block 212 those candidate flows that can be determined not to lead to a valid assignment of test system resources to pins that would be required to perform a test according to the candidate flow.

Candidate flows may be selected for removal from consideration at block 214 based on any suitable criteria. A candidate flow may be eliminated from consideration if the candidate flow specifies concurrent execution of two test blocks that cannot accurately be performed together. As one example, candidate flows may be eliminated if they require concurrent execution of portions of the device under test that will interfere with each other. As a specific example, testing operation of an RF-transmitter core may interfere with testing of an RF-receiver core. Accordingly, a test flow that includes concurrent execution of test blocks associated with the RF-transmitter and RF-receiver, respectively, may be eliminated. Other conflicts may be identified based on overlapping pin usage. For example, FIG. 4A illustrates that test block C tests a portion of die 132 that includes pins that are also involved in test blocks B and D. In this specific example, flows that entail concurrent execution of test block C with either test block B or D may be eliminated. In the example of FIG. 4B, FLOW 3 may be eliminated at block 214 for this reason. As another example, when a set of blocks requires for testing a collection of independently operating resources that exceeds the resources of the test system, those blocks may be identified as conflicting and candidate flows that require concurrent execution of those blocks may be filtered out. Any other suitable criteria may be used at block 214 to filter out candidate flows that may be identified as not leading to a workable, concurrent test plan. For example, input 324, identifying known conflicts, may be applied at block 214 to also filter out flows. Also, it should be appreciated that the function of block 214 need not be implemented as a separate step from enumerating combinations of flows. In some scenarios, for example, rules for forming combinations of test blocks may be applied to preclude impermissible flows from being generated at block 212.

Regardless of the manner in which candidate flows are filtered out, the process may proceed to block 216 where the remaining candidate flows are further processed. In block 216, the candidate flows are sorted to define an order in which candidate flows are used in attempting to find a valid assignment of test system resources to pins. At block 216, the candidate flows may be sorted to order the flows from fastest estimated test time to slowest. The estimated test time of each flow may be computed based on inputs 322 or other suitable information from which the test execution time for each test block may be determined. The execution time for sequentially executing blocks may be summed to produce an overall estimate of the execution time for a flow. As an example, FLOW 1, which entails sequential execution of test blocks A, B, C and then D, the test execution time may be computed by summing the individual estimates for test execution time for each of test blocks A, B, C and D. For candidate FLOW 2 in which test block B is executed followed by execution of test blocks C and D, the test execution time may be computed by summing the individual estimates for test execution time for each of test blocks B, C and D. Because test block A executes concurrently with test block B, portions of the execution time of test block A are not included in the overall test execution time for FLOW 2.

Regardless of the number of candidate flows, the overall test execution time may be computed for each candidate flow and used to order the candidate flows from fastest to slowest test execution time. This ordering may be captured in any suitable way. In some embodiments, ordering may entail re-arranging information about each of the candidate flows such that it is physically stored in computer memory in the defined order. Though, in other embodiments, ordering may entail storing information defining the order without altering the manner in which the information is stored in computer memory.

Once the candidate flows are ordered, the process proceeds to block 218 (FIG. 2). When execution follows this path, candidate flows from the full set are considered in order provided to determine whether a successful resource assignment can be identified. In embodiments in which a flow iterator is used, candidate flows may similarly be considered in turn.

A second option for generating candidate flows is illustrated by processing at block 215. In block 215 processing to create a flow iterator is performed. The flow iterator may be created by configuring software to generate candidate flows according to one or more heuristics. The iterator can generate flows iteratively, meaning that, as processing on one flow is completed, processing to generate another flow may be performed.

Here a heuristic may be implemented by a program to capture logic identified by a human. That logic may be captured in lines of source code, by rules executed by a rules engine or in any other suitable way. The heuristics here capture logic as to characteristics of a candidate flow that relates to the likelihood that the candidate flow will execute quickly and/or that a successful mapping of resources can be identified for that flow.

A specific example of a heuristic is that flows with fewer flow steps are likely to be faster than flows with more flow steps. Other heuristics may be based on the likelihood that a resource mapping will be successful. For example, flows that include a flow step with test blocks that collectively have pins constituting a large percentage of the channels of the tester are less likely to lead to a successful routing than flows in which the maximum number of pins involved in each flow step is a smaller percentage of the number of channels. Similar heuristics may be defined based on resource requirements or other criteria that can be ascertained before an attempt to make a mapping between pins and resources. These heuristics may be used separately or together. If used together, any suitable weighting or other technique may be used to combine the heuristics.

Here, two types of flow iterators may be supported, and user input may designate that one or the other is used. In this example, one type of iterator may implement a "smart-iterative" approach to candidate flow generation. A second type of iterator may implement a "smart-random" approach. The smart-iterative approach may entail starting with most concurrent flows and, in successive iterations, move to less concurrent flows. The smart-random approach may entail randomly generating flows, but once a resource mapping is identified for a candidate flow, only subsequent candidate flows that are expected to execute in a faster time are supplied.

An approach of generating a complete set of candidate flows may ultimately lead to identification of the fastest possible test time. However, for even a relatively small number of test blocks, there are potentially a large number of candidate flows. For the tool to generate all such candidate flows, and perform computation to determine whether a resource mapping is possible for each candidate flow, may require more processing time than is feasible, particularly if the tool is to be operated in an interactive way. The "smart-iterative" approach may execute faster and, nonetheless, have a good likelihood of identifying a flow that executes as fast, or nearly as fast, as the fastest possible flow. Accordingly, "smart-iterative" may be selected by a user when processing of a complete set is impractical. The "smart-random" may provide even faster execution time than the "smart-iterative" approach, and may be selected for tests with an even larger number of test blocks.

In some embodiments, a tool may contain modules that perform functions associated with each of these, or other, options for generating candidate flows. A tool may be implemented with a collection of modules and a further module that receives user input that indicates which function is to be executed. That module may selectively invoke other modules based on the specification.

In some embodiments, some processing may be common to more than one option. For example, a filtering step comparable to block 214 may be performed, even if a flow iterator is constructed at block 215. The filtering may be applied after candidate flows are generated. Alternatively or additionally, steps that achieve a comparable amount of filtering may be applied to suppress the generation of candidate flows. In embodiments in which candidate flows are generated iteratively, attempting to make resource assignments to candidate flows as they are generated, the filter criteria may be modified dynamically. For example, information about conflicting blocks generated in one iteration may impact filter criteria used in generating a later candidate flow.

Regardless of how a candidate flow is obtained—whether by selection from a previously generated set or generated iteratively—an attempt may then be made to identify a resource assignment for the candidate flow. At block 218, the tool attempts to find one or more valid resource assignments for one or more of the candidate flows. The tool may use information about the ordering of flows to preferentially search for valid assignments associated with faster flows. Ordering information may be obtained by sorting at block 216 or implied by the order in which candidate flows are generated by a flow iterator. Regardless of how such an order is defined, by searching for valid assignments in this order, the tool may stop searching for valid assignments once a desired number of valid resource assignments is identified, because, in the embodiment illustrated, further searching will not identify a resource assignment that supports a faster concurrent test plan, making it unlikely that a more efficient test plan will be identified. Though, in some embodiments, attempts to make a resource assignment may be made until the full set of candidate flows has been processed. In other embodiments, candidate flows will be generated until some termination condition is reached. That termination point, for example, may be the passage of an amount of time or the execution of a number of iterations. Alternatively, a metric associated with test execution time or other criteria may be used to determine when a sufficient number of candidate flows have been evaluated.

The manner in which a valid resource assignment is identified is described in greater detail in conjunction with FIGS. 5-8 below. Regardless of the manner in which the valid assignments are identified, the process may proceed from block 218 to 220. At block 220, the tool may provide outputs, including outputs identifying concurrent test process parameters in scenarios in which the search for valid resource assignments at block 218 identifies one or more valid resource assignments. In scenarios in which the search at block 218 does not identify any valid resource assignments, the output at block 220 may identify that no valid resource assignments were identified and may include information identifying why a valid resource assignment could not be identified. As an example, the output at block 220 in that scenario may include an indication of a required resource for which there was no resource available for assignment.

FIG. 3 illustrates outputs 370 that may be provided by the tool 350 executing the process of FIG. 2. These outputs may be provided simultaneously to a user. Alternatively, the various outputs may be provided as requested by a user, such as by accessing controls presented in a graphical user interface.

The illustrative outputs in FIG. 3 include outputs 372 identifying conflicts between pins and/or test blocks such that a flow requiring concurrent execution of the conflicting test blocks or the concurrent operation of a test pin could not lead to a valid resource assignment. In iterative embodiments, in addition to outputting this information, the tool itself may use such information, generated in earlier iterations, in later iterations to influence generation of further candidate flows.

Output 374 may identify the candidate flows that were identified. In some embodiments, a single candidate flow may be identified. Output 374 may include all of the flows identified at block 212 or those considered after filtering at block 214, Output 376 may identify flows for which valid resource assignments were identified at block 218. In some embodiments, a tool may output a single valid resource assignment such that it may stop processing once a valid resource assignment is identified. In other embodiments, a tool 350 may identify multiple flow options, with execution time, required system configuration or values of other parameters associated with those options, such that a user may select a flow with desired characteristics.

Outputs 378 may include estimates of the test time associated with the candidate flows identified in outputs 376. Output 380 may identify the valid resource assignments identified at block 218. If searching for valid resource assignments at block 218 did not identify any valid resource assignments, output 382 may identify the conflicts or resources lacking in order to complete a valid assignment of resources to all pins or provide other information generated by tool 350 that could indicate why a valid assignment was not identified.

Regardless of the nature of the outputs provided at block 222 (FIG. 2), a user of tool 350 may review the outputs and then input other values of the inputs 310 such that the tool may search for valid resource assignments based on other parameters. For example, in scenarios in which a valid resource assignment is achieved for a number of target sites specified in input 318, the user may request tool 350 to attempt to achieve a valid resource assignment for a higher number of target sites.

Conversely, an output 382 may indicate conflicts or limitations that precluded a successful resource mapping for a candidate flow or flows. In embodiments in which a flow iterator is activated, this information may be generated in one iteration and used in a subsequent iteration to influence generation of candidate flows. This information alternatively or additionally may be provided to a user. For example, when output 382 indicates that no valid assignment was found, a user may change input 318 to reduce the number of target test sites.

Alternatively or additionally, a user may alter input 320 specifying a different target tester configuration. As an example, a user may specify additional resources in the test system when output 382 indicates a lack of a specific type of resource precluded finding a valid assignment. Similarly, a user may specify a target test system configuration at input 320 with additional resources if output 378 provides a test time estimate that is longer than desired. Conversely, a user may decrease the amount of resources in a target test system configuration specified at input 320 if the outputs 376 and 378 indicate a valid resource assignment that leads to execution of a test flow faster than required. In this way, a user may manipulate the inputs and observe outputs 370 to quickly identify values for parameters of a concurrent test plan that provides a desired trade-off between test system resources and test time.

As shown in FIG. 2, the process may loop back to block 210 iteratively until the user indicates at decision block 222 that a desired concurrent test plan is generated. In this scenario, the process may proceed to block 224. At block 224, the outputs of tool 350 may be deemed as defining the concurrent test plan. The resource assignment, such as is generated at output 380, may be used to specify the construction of a DIB, such as DIB 112 to connect resources within a test system 100 to test probes that may couple signals to a device under test while the concurrent test plan is executed. At block 226, this concurrent test plan may then be applied in the manufacture of the semi-conductor device. For example, a semi-conductor device manufacturer may configure multiple test systems according to the concurrent test plan and, as devices are being fabricated, test devices according to the concurrent test plan. Devices passing the test may be further processed and shipped to customers. Devices that do not pass the testing may be discarded, reworked, sold as degraded or otherwise disposed of.

Efficient execution of the process of FIG. 2 may depend on rapid identification of valid resource assignments at block 218 or, if a valid resource assignment is not available, rapid identification of that fact. In some embodiments, a tool 350 may rapidly identify whether a valid assignment is possible, and if so the assignment, by grouping associated pins and identifying resource requirements for each group. Those requirements may be expressed in the form of resource engine requirements. Additionally, the instruments within the test system may be represented as resource engines, with each resource engine consisting of a set of individual resources that collectively perform a common function.

Figure 5:
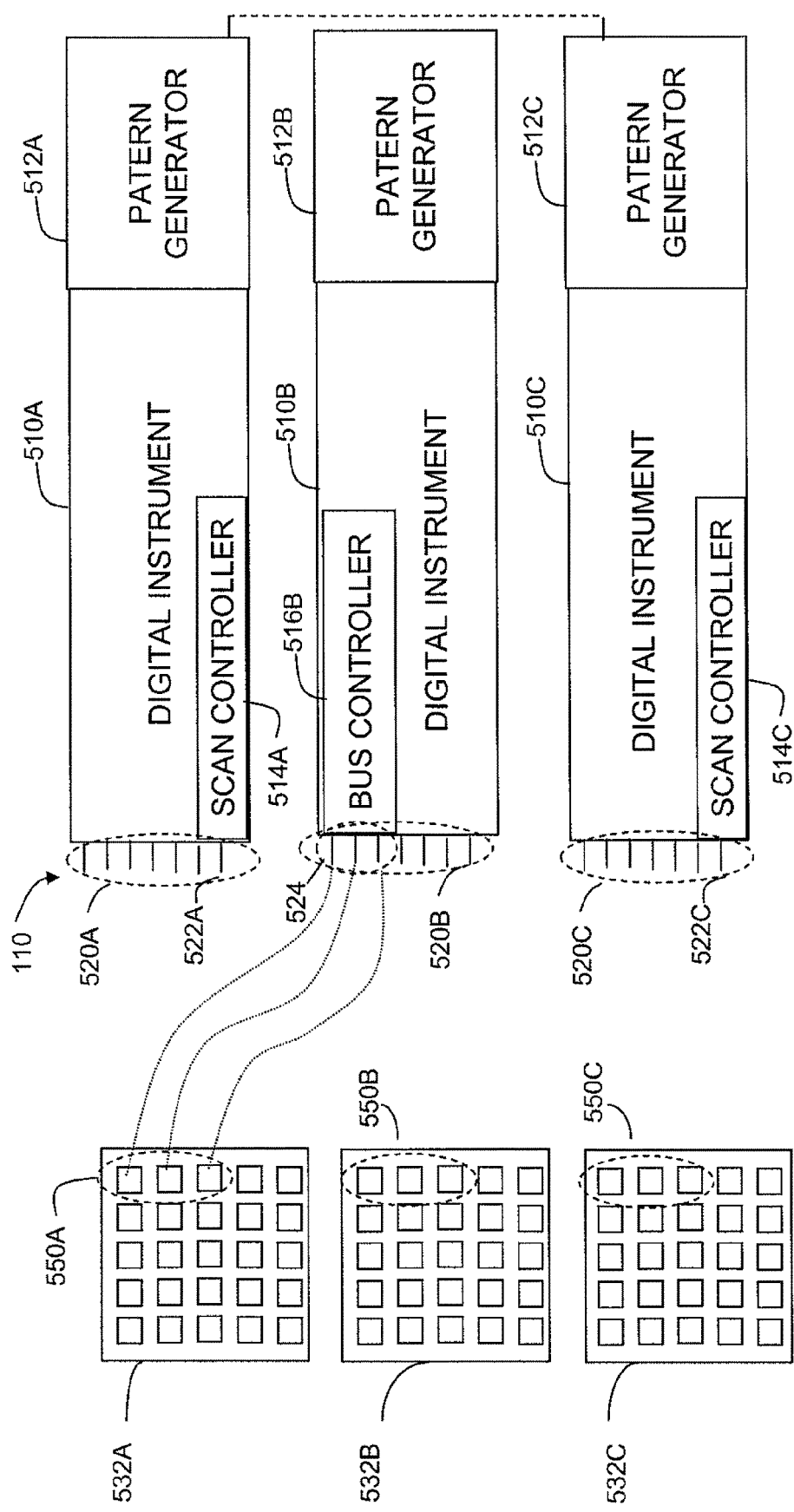
FIG. 5 is a schematic illustration of a mapping between a resource engine requirement for a group of associated pins and a group of associated test system channels forming a resource engine.

An example of a mapping between resource requirements and resource engines is provided by FIG. 5. In the example of FIG. 5, three instruments are illustrated, digital instruments 510A, 510B and 510C. Each of the digital instruments includes a collection of I/O pins, each of which is connected to a test system channel 110. Each of these input/output (I/O) channels may be regarded as a test system resource. Each such resource may be capable of generating or measuring a digital signal.

Though, FIG. 5 illustrates that the tester channels 110 are not completely interchangeable, because some of the outputs of digital instruments 510A, 510B and 510C can perform functions that can not be performed by other test system channels. Resource engines may be defined as including groups of channels 110 based on the functions that can be performed by the instruments connected to those channels.

The simplified example of FIG. 5 illustrates multiple ways in which the channels associated with digital instruments 510A, 510B and 510C may be groups based on function. Each of these groupings may be treated at as a "resource engine." One parameter for grouping channels 110 into resource engines may be by time domain. Each of the digital instruments 510A, 510B and 510C includes an associated pattern generator 512A, 512B and 512C, respectively. Each of the pattern generators 512A, 512B and 512C may be programmed to operate in a separate time domain. Though, in the embodiment illustrated, some of the pattern generators, such as pattern generators 512A and 512C, may be synchronized such that the channels associated with different ones of the digital instruments, 510A, 510B and 510C may operate in the same time domain, the individual I/O's for the same digital instrument cannot be controlled to operate in different time domains. Accordingly, the set 520A of channels associated with digital instrument 510A may define a resource engine providing signals in a common time domain. Likewise, set 520B and 520C may each define a resource engine having a set of inputs/outputs in a common time domain.

Other functions of the instruments may define other resource engines. For example, digital instruments 510A and 510C are each configured with a scan controller, 514A and 514C respectively. Scan controllers 514A and 514C may be controlled to operate on an associated one of the channels 110 as a serial I/O pin of the type that may be used in a scan test. Accordingly, the channels associated with scan controllers 514A and 514C may each be regarded as a further resource engine. Accordingly, FIG. 5 show resource engine 522A that includes the set of channels 110 that can be coupled to scan controller 514A. Similarly, resource engine 522C includes the channels that can be coupled to scan controller 514C. Each of resource engine 522A and 522C may be treated as a resource engine that operates either as a digital pin or a scan controller.

As another example of a resource engine, FIG. 5 illustrates that digital instrument 510B also includes a bus controller 516B. Bus controller 516B may be operated during a test to cause a collection of channels to operate in synchronization according to a bus protocol. Accordingly, FIG. 5 shows a set of channels 110 coupled to bus controller 516B that can operate as a resource engine 524. In this case, resource engine 524 provides a set of digital I/O channels that can also operate as a bus. Though four types of resource engines are illustrated in FIG. 5, any number and type of resource engines may be defined based on the physical instruments within a test system. In addition to those resource engines illustrated in FIG. 5, resource engines may be associated with tester channels, whether separately or in association with other tester channels, that can generate or measure any desired type of signal. Examples of such resource engines may include digital channels that can generate or measure DC signals, analog channels that can generate signals of specific frequencies, or analog channels that can generate signals with wave forms of arbitrary shapes.

It should be recognized that the signals processed by resource engines are ultimately generated or measured by instruments installed within test system 100. However, the resource engines are created by tool 350 as a representation of the capabilities of a target test system according to a configuration such as may be specified by input 320 (FIG. 3). Accordingly, resource engines may be defined by tool 350 in any suitable way, such as by storing information in computer memory. Likewise, resource engine requirements are defined by tool 350 based on processing inputs about the device and test in conjunction with information about physical resources in a target test system. The resource engine requirements can likewise be represented in any suitable way, including in memory structures in computer memory.

FIG. 5 also illustrates a manner in which assignments are made between test pins and test system channels based on resource engine requirements associated with groups of test pins and resource engines defined for groups of test system channels. FIG. 5, illustrates three test sites 532A, 532B and 532C for which assignments are to be made. Such a configuration is representative of a scenario in which input 318 (FIG. 3) indicates a target site count of three sites. Though, the number of sites for which assignments are made concurrently is not critical to the invention.

Each of the sites 532A, 532B and 532C contains multiple pins, each of which will be mapped to a tester channel 110 if a valid assignment can be identified. Tool 350 may operate by identifying groups of associated test pins in each of the sites and then identifying a resource engine requirement for the group. Associated test pins may be identified based on inputs 310, including pinout 312, which identifies functions of signals that may be applied to or sensed at various test pins of a device under test. Tool 350 may apply association criteria, which may be preprogrammed into tool 350 or otherwise available for application by the tool. Each of the association criteria may specify characteristics of pins that should be grouped together and if groups of pins meeting those characteristics are identified, they may be grouped for purposes of identifying resource engine requirements.

For example, information about the time domain with which each pin is associated may allow tool 350 to identify groups of pins that are associated based on time domain. Such an association may be useful in identifying a resource engine requirement, namely that the associated pins in the group be mapped to a resource engine that provides signals in the same time domain.

As another example, information indicating that a group of pins provides access to the signal lines on a bus may be used to form a group of associated pins. Such information may also allow identification of a resource engine requirement for that group, namely that the pins of the group be mapped to a resource engine that can generate or measure related signals representative of the signals that may occur on a bus.

As yet a further example, information may allow two pins that are coupled to respective legs of a differential pair within a device under test to be associated. For such a group of associated pins, a resource engine requirement may be defined indicating that the group of pins should be associated with channels forming a resource engine with the capability to stimulate or measure a differential signal pair.

As yet a further example, a pin may be identified as being coupled to a serial test port. For such a group, even if the group contains only a single pin, a resource engine requirement may likewise we defined. In this case, the resource engine requirement indicates that a pin of the group should be assigned to a channel associated with a digital source and/or capture functionality of an instrument that can provide a scan control function.

The number and type of associated groups of pins may depend on the design and operation of a device under test, and is not critical to the invention. Further, though FIG. 5 illustrates that each pin is associated with only a single resource engine requirement, the invention is not limited in that way. For some devices under test, a single pin may have a requirement for multiple resource engines. Also, it should be appreciated that FIG. 5 illustrates resource assignments at one instant in time. Resource engine requirements depend on the function being performed by a pin at the time. Accordingly, different resource mappings may be specified for different times during a test flow. In some embodiments, this time dependence may be reflected by assigning a resource engine to a pin group while the pins in that group are being used to perform a first function. At a later time, when those pins are being used to perform a different function, those resources may be released. Those released resources may be allocated to other pins, and other resources may be allocated to the pins. In some embodiments, allocations may be made for the duration of a flow step. During execution of a test, for example, the test system may allocate resources at the start of a flow step and make a corresponding release of resources at the end of the flow step. Though, it should be appreciated that the interval for which resource assignments are made can be of any suitable duration and may be coarser or finer than a flow step.

Regardless of the number and type of groups of associated pins identified for a device under test, the identification of groups and associated resource engine requirements allows a search for appropriate mappings between pins and channels without the necessity of considering every possible mapping between pins and channels. To find such mappings, tool 350 attempts to match a resource engine to each resource engine requirement in such a way that any rules or other criteria for operation of a physical resource, such as an instrument, providing the functionality of the resource engine assignment are met. These requirements may be provided as rules or associations or in any other suitable form.

For example, once a group 550A of associated pins has been identified and a resource engine requirement defined for the group, a valid mapping will include an assignment of the pins in group 550A to channels associated with a resource engine that meets the resource engine requirement. In this example, such a resource engine includes a bus controller. In the simple example of FIG. 5, the pins of group 550A are quickly associated with the channels associated with resource engine 524 based on this information.

Similar mappings can be made for groups 550B and 550C. Because the test system configuration of FIG. 5 contains only one resource engine with a bus controller, tool 350 could quickly identify that the pins of groups 550B and 550C would likewise need to be mapped to the channels of resource engine 524. Such a mapping may be a valid assignment, depending on the capabilities of the physical instrument implementing resource engine 524. If rules specified in conjunction with instrument 510 indicate that resource engine 524 has a maximum fan out of less than three, meaning that each channel cannot simultaneously be connected to three pins, tool 350 may quickly identify that a valid mapping between pins and channels is not possible in a concurrent test plan of three sites based on the test system configuration illustrated in FIG. 5. In this scenario, tool 350 may output an indication that the assignment failed because the test system has an insufficient number of bus controller resources. Conversely, if the channels of resource engine 524 can fan out to three or more pins, mappings from the pins groups 550A, 550B and 550C may be quickly made to the channels of resource engine 524. Assignments for other pins may then be considered.

Figure 6:
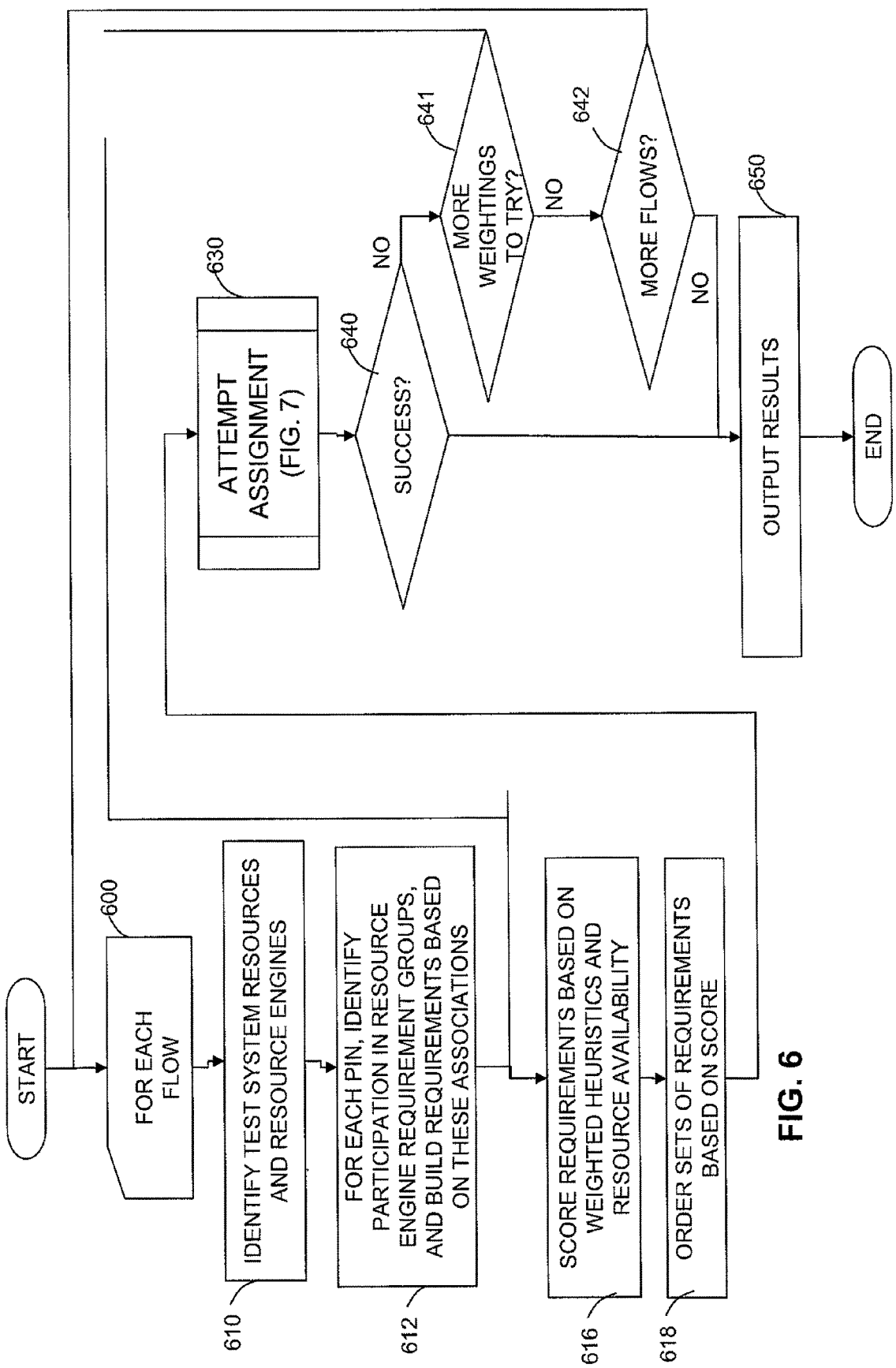
FIG. 6 is a flow-chart of a process of assigning test system channels to pins by matching resource engine requirements to resource engines.

The approach of identifying resource engines and groups of pins with associated resource engine requirements and then making mappings based on this information may be extended to quickly identify mappings for other pins of a device under test. FIG. 6 illustrates a process in which this approach may be used.

FIG. 6 illustrates a process that may be used to search for valid resource assignments as in block 218 (FIG. 2). This process may be implemented by tool 350 or in any other suitable way.

The process of FIG. 6 may begin a loop at block 600. At block 600, a candidate flow is selected. Such a selection may be based on the ordering determined at block 216. Though, in embodiments in which a flow iterator is used, the candidate flow may be selected by obtaining a candidate flow from the flow iterator. As a further possibility, the candidate flow may be provided as user input. Such input may be provided, for example, in a scenario in which the process of FIG. 6 will be used to allow a tool to output an indication of whether a successful resource assignment can be made for the candidate flow.

Regardless of how the candidate flow is selected, in the loop, an assignment of resources is attempted. The assignment, to be valid, must allow execution of the selected candidate flow. The loop starting at block 600 may be repeated until a successful assignment is identified for one candidate flow or, in some embodiments, a desired number of candidate flows.

Based on the selected candidate flow, the process proceeds to block 610 with an identification of test system resources and resource engines. Processing at block 610 to identify resource engines may be based on inputs received at block 210 (FIG. 2), including inputs 320 defining a test system configuration. The identification performed at block 610 may be performed in any suitable way. However, as one simple example, processing at block 610 may be based on stored information describing functional capabilities of instruments included in the target test system configuration. In may be known in advance, for example, that certain models of digital instruments, such as digital instrument 510A or 510C, contain scan controllers. Based on the number of digital instruments of this type in target tester configuration, a number of resource engines providing scan control may be determined. Likewise, certain models of digital instrument, such as digital instrument 510B, may be configured with the bus controller. The number of such instruments may define a number of resource engines that provide bus control functionality. Other characteristics of the instruments in the target tester configuration may define other resource engines, and it should be recognized that FIG. 5 is only an example of the number and type of resource engines that may exist based on a target tester configuration.

Regardless of the number and type of resource engines that exist for a target test system configuration, once the resource engines are identified, processing may proceed to block 612. At block 612, pin groups may be identified. The pin groups may be identified based on associations that have been previously defined, with each association indicating criteria for grouping pins. Each association may specify a relationship between one or more pins that, if such a relationship exists for a group of pins in a device under test, the pins should be associated as part of a group. The associations may be preprogrammed as part of the tool or may be added or updated based on user input. The associations may be recorded in computer memory such that they may be accessed by the tool in operation. As recorded in computer memory, the associations may have any suitable form, including "if-then" rules or a listing of characteristics of pins that are associated.

The specific associations available to tool 350 may depend on the nature of the device under test. Though, in general, the associations may identify groups of pins that operate together in the course of performing an operation. For example, pins that either input or output signals such as may appear on a bus may be associated. Pins that input or output a differential signal may also be associated. As yet a further example, pins that input or output signals that may be inputs or outputs to a scan port on a device under test may similarly be associated. Pins that are coupled to signals within a single time domain may also be associated. It should be recognized, though, that the number and types of associations that tool 350 may recognize is not critical to the invention.

In some embodiments, each pin may be associated with a single group. Though, it should be appreciated that in other embodiments, a pin may be associated with multiple groups. Though, in yet further embodiments, a pin that might have multiple functional requirements during the same test block may be represented as a group of that single pin associated with all of the functional requirements collectively. These requirements also may be different for different times during the test flow.

In some scenarios, a pin group may contain as few as a single pin, which may be regarded as a "flat" pin. In some embodiments, flat pins may be processed differently than a pin group, with a resource assignment done on a pin-by-pin basis. Flat pins may be used to represent pins that have different functions in different test blocks such that they have different resource requirements, or participate in one or more pin groups at different times. Accordingly, the tool may support defining a resource mapping that includes allocating and releasing resources for such flat pins at appropriate times. Though, it should be appreciated that the number of pins in a group and the length of an interval during a test flow in which an assignment of resources to that group lasts is not critical to the invention. Accordingly, it should be appreciated that "flat" pins may be processed along with pin groups in making assignments of resources to pins.

In embodiments in which multiple sites are tested during a flow, groups may be formed to represent the instances of the pins in each of the sites. Though, because corresponding devices in each of the sites have corresponding functions, corresponding groups will exist in each of the sites.

Figure 8:
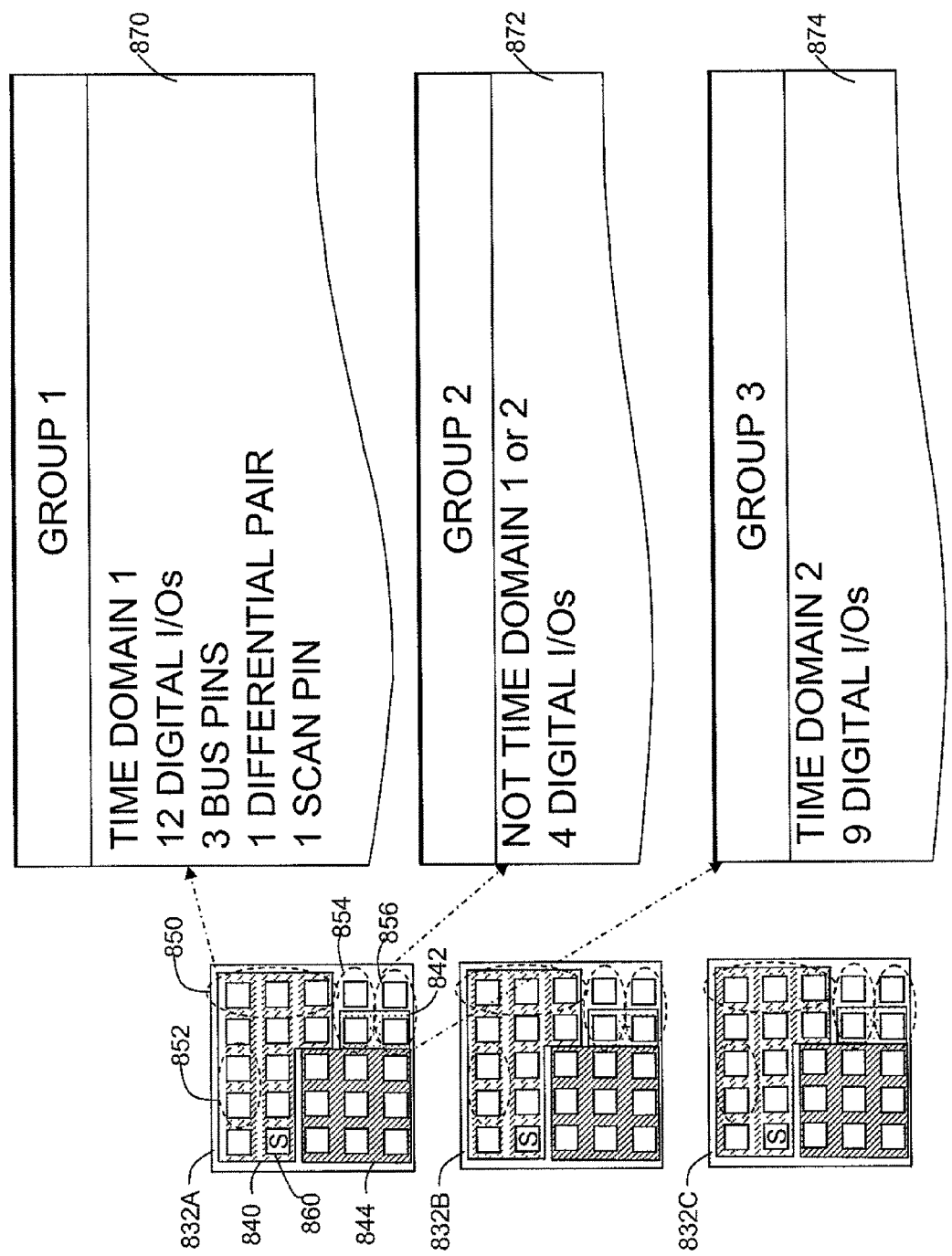
FIG. 8 is a schematic illustration of sets of resource requirements identified for groups of associated pins.

FIG. 8 illustrates formation of pin groups based on associations. Three test sites 832A, 832B and 832C are illustrated in FIG. 8. However, because the groups in test sites 832B and 832C will correspond to the groups identified for test site 832A, for simplicity, groups within test site 832A only are illustrated. In test site 832A, associations between pins are identified. The example in FIG. 8 illustrates that pins may be part of more than one association. Accordingly, the groups are formed such that all pins that are associated are within the same group. As a specific example, each group may be formed to contain the smallest possible number of pins that satisfies the criteria that each group contains every other pin with which any pin in the group is associated.

Any suitable computational technique may be used to identify groups of pins satisfying such a criteria. In the example of FIG. 8, associations 840, 842, 844, 850, 852, 854 and 856 are illustrated. These associations may define any suitable relationship between pins, such as a relationship between required timing of signals applied to the pins or relationships in terms of functions performed by the pins. The associations identified for the pins in test site 832A form three groups of pins. The first group is defined by the pins related by association 840. In this case the pins related by associations 850 and 852 are only contained within GROUP 1. GROUP 2 is defined by the pins related by association 854. GROUP 3 includes the pins related by association 842 and the additional pins related to those pins by associations 854 ad 856. In this way, each of the groups contains pins, each of which is associated with at least one other pin in the group and none is associated with a pin outside the group. Similar groupings will apply for each of the other test sites 832B and 832C, though not expressly illustrated in FIG. 8.

Returning to the process of FIG. 6, once the groups are identified at block 612, resource engine requirements may be identified for each of the groups. Each group may contain multiple resource engine requirements based on the number and type of pins contained within the group. FIG. 8 illustrates schematically resource engine requirements 870, 872 and 874 associated with GROUP 1, GROUP 2 and GROUP 3, respectively. The resource engine requirements may be formed by operation of tool 350 and temporarily stored in computer memory for use in subsequent operations performed by the tool. The specific format used to store resource engine requirements is not critical to the invention, and any suitable representation may be used.

The resource engine requirements may be identified based on the functions associated with each of the pins within a group. These requirements also may be identified based on inputs relating to the device under test, such as information defining the structure and function of each of the test pins or information relating to operation of a test program or candidate test flow being evaluated. Such information may be mapped to specific resource engine requirements by applying information programmed into tool 350. As a specific example, for GROUP 1, resource engine requirements 870 have been identified to indicate that all of the pins within GROUP 1 must receive signals from instruments operating in a single time domain, identified as time domain 1, in order for a valid assignment to exist. Time domains are known in the art and may indicate that the pins in a specific time domain operate on signals that are coherent with a particular timing source, which may be programmable. By providing multiple time domains, different pins may operate with different timing, and that timing need not by synchronized.

Additionally, GROUP 1 requires twelve digital pins, which must meet additional "overlay requirements" of three being bus pins, two forming a differential pair and one being a scan pin. Though, it should be appreciated that these specific examples are illustrative of the nature of resource engine requirements that may exist for a group, and that different or additional resource engine requirements may exist for different groups and for different types of devices under test. Also, it should be recognized that, though the resource engine requirements of a pin are shown by assigning a single resource engine to that pin, there is no requirement that each requirement be met by a single resource. A resource engine requirement may be met by multiple resource engines, which may be part of the same physical resource, such as an instrument, or may be distributed across multiple physical resources. Such multiple resource engines may be assigned to the pin for the duration of the test flow or for any interval during the flow.

Requirements 872 indicate the resource engine requirements that must be met by assignment of test system channels to pins within GROUP 2 in order for a valid assignment to exist. In this example, the resource engine requirements 872 require four digital I/Os that are not in time domain 1 or time domain 2. Resource engine requirements 874 indicate that the pins in GROUP 3 collectively require nine digital I/Os in a time domain 2.

Though, it should be appreciated that the resource engine requirements can be in any suitable form and there may be any number of resource engine requirements. At block 612, a set of requirements may be defined that captures requirements for each pin in each site, including how each pin can or cannot interact with other pins during a flow. These requirements can define characteristics of required or prohibited assignments for each pin in each site.

Regardless of the number and type of resource engine requirements identified for multi-pin groups and single pins that are not associated with other pins in a group, once the resource engine requirements are identified, processing may proceed to block 616. At block 616, the sets of resource engine requirements for each of the single or multi-pin groups may be scored. In the embodiment illustrated, the score indicates a degree of difficulty in matching resource engines to the resource engine requirements of a group. In the embodiment illustrated, the score is assigned based on weighted heuristics and resources availability. Though, such a score may be assigned in any suitable way. As an example, a value may be assigned to each resource engine requirement that is proportional to the number of resource engines in the target test system configuration that can fulfill that requirement. The values may alternatively or additionally be scaled based on the number of groups having a resource requirement that is met by the same type of resource engine. In this way, a value assigned to each resource engine requirement may increase in relation to the scarcity of the resource engine type and also in proportion to the demand for the resource engine type that meets the resource engine requirement.

Further, these values may be weighted based on resource engine types. Such a weighting may influence an order in which resource assignments are attempted. By varying such a weight, the order in which resource assignments are attempted can be varied. Accordingly, such a weight may be used in an iterative process of searching for a valid assignment of resource engines to resource engine requirements, with the weighting being changed to alter the nature of assignments attempted. Any weighting that suitably changes the order may alternatively or additionally be applied in computing a score.

Appropriate values to use in computing a score may be determined in any suitable way. In some embodiments, the values may be computed dynamically based on the aggregate of the resource engine requirements computed at block 612 and the aggregate of all resource engines identified at block 614. In other embodiments, the value may be precomputed and stored in computer memory for use in conjunction with tool 350 based on historical data of test system configurations and historical data indicating resource engine requirements for testing other devices.

Regardless of the specific manner in which values are associated with resource engine requirements, the values for the requirements in each of the group may be combined to yield an overall score for the group. As one example, the values for requirements associated with each group may be combined by summing the individual values. Though, other approaches for combining values are possible, such as by forming a weighted average or selecting the maximum value as the score for the group.

Regardless of the specific approach used to compute a score for each group, once scores are computed, the process may proceed to block 618. At block 618, the sets of requirements for the groups, including flat pins, may be ordered in relation to their respective scores. Ordering at block 618 may identify groups for which a valid resource requirement would most likely not be possible if resources are allocated to pins in a random order. In subsequent processing, the ordering performed at block 618 may be used to construct candidate resource assignments by assigning resources to the most challenging groups first.

Factors in addition to the scores may be used at block 618. As one example, corresponding groups associated with multiple sites may be ordered so as to be consecutive. Such an approach may facilitate use of certain assignment heuristics that lead to similar treatment of corresponding groups in every test site.

Once the groups are ordered at block 618, processing may proceed to sub-process 630 where tool 350 attempts to assign resource engines to meet the resource engine requirements. The processing performed in sub-process 630 is described in further detail in connection with FIG. 7 below. Briefly, though, processing in sub-process 630 entails an iterative process of making candidate assignments of resource engines to resource engine requirements such that physical resources implementing the resource engines can be mapped to pins in each test site associated with the resource engine requirements. The candidate assignments are made in the order in which the resource engine requirements are ordered at block 618. As each resource engine requirement is considered, if a resource engine meeting the requirement is available, a candidate assignment is made. If multiple resource engines could be assigned to meet a requirement, heuristics are applied to select among the possible resource engines. If candidate assignments can be made for all of the resource engine requirements, sub-process 630 ends with a successful assignment of resource engines to resource engine requirements, which may be used to define a mapping between pins and the channels of the test system associated with individual resources. Such an approach provides a high likelihood that, if a valid resource assignment exists, it can be quickly identified.

Accordingly, if sub-process 630 ends with a successful assignment, processing may proceed from decision block 640 to block 650 where results are output. The results output at block 650 may be in any suitable form, including as in output 370 (FIG. 3) described above.

In the embodiment illustrated, sub-process 630 is structured to limit the number of attempts that are made to find a valid resource assignment based on a specific ordering of resource engine requirements. As a specific example, two or three attempts may be made to match resource engine requirements to resource engines based on a specific ordering of the resource engine requirements. Regardless of the number of attempts, if processing at sub-process 630 does not identify an assignment that successfully maps resource engine requirements to resource engines in the target test system configuration, sub-process 630 may end without a successful assignment. In this scenario, processing may branch from decision block 640 to decision block 641.

At decision block 641, a consideration of the number of attempts to find a valid mapping for a candidate flow is made. As described above, resource engine requirements are ordered at block 618 in a way intended to lead to a rapid identification of a valid resource mapping, if one exists. In some embodiments, if a valid resource mapping cannot be found for a first ordering, an attempt may be made to make a valid assignment based on a different order. Though, the number of attempts may be limited, because, if a valid assignment cannot be found with the first few preferred orderings, the likelihood of finding a valid mapping decreases. Accordingly, processing at decision block 641 entails determining whether a further ordering of resource engine requirements should be tried.

If so, processing may loop back to block 616 where a different weighting of resource engine types is applied, and the ordering of resource engine requirements is recomputed. A different weighting, for example, may reverse the relative weightings of two resource engine types that are both relatively scarce. In this way, at each iteration a different permutation of ordered resource engine types may be used.

Conversely, if it is determined at decision block 641 that no further ordering of resource engine requirements is to be tried, such as because the number of attempts exceeds the threshold, the process may branch to decision block 642.

At decision block 642, the process may again branch, depending on whether further candidate flows remain for an attempted assignment. The number of flows for which assignments are attempted may depend on the specific approach selected by an operator of the tool or other input.

In a scenario in which a flow iterator has been created, processing may loop back to block 600 based on conditions, such as the number of candidate flows considered, the time for which the tool has been iterating or the number and/or suitability of candidate flows for which a valid flow was identified.

In some embodiments, if a valid assignment cannot be made for a first, fastest flow, assignments may be attempted based on a next flow. As described above in connection with FIG. 2, the candidate flows may be ordered from fasted to slowest, which will generally create an ordering from more parallelism to less parallelism in the test process. As the degree of parallelism decreases, the number of groups and the associated requirements of the groups may decrease. For example, when the pins of GROUPS 1 and 2 as illustrated in FIG. 8 are tested concurrently, there is a requirement that the pins in GROUP 1 be coupled to a resource engine operating in a different time domain than the resource engine coupled to the pins in GROUP 3. This requirement may limit the type of resource engines that can provide test signals to the pins in GROUP 1 and the pins in GROUP 3. However, if the pins in GROUP 1 and GROUP 3 are tested sequentially, the requirement for resource engines operating in separate time domains no longer applies. The requirements for GROUP 1 and GROUP 3 may be met, for example, by resource engines that part of the same digital instrument. Thus, by selecting a different flow and repeating the processing including sub-process 630, a successful assignment may be identified.

Accordingly, processing may loop back from decision block 642 to block 600 until a successful assignment is made or no further flows remain. If no further candidate flows remain, or a timeout or other termination condition is reached, processing may branch from decision block 642 to block 650. At decision block 650, outputs, such as outputs 370 (FIG. 3) may be provided. However, when processing reaches block 650 based on the branch from decision block 642, indicating that no successful assignment was identified for any possible flow, the results output at block 650 may indicate this fact. For example, outputs 382 may indicate the conflicts or limitations in system resources that led to a resource engine requirement not being filled.

Figure 7:
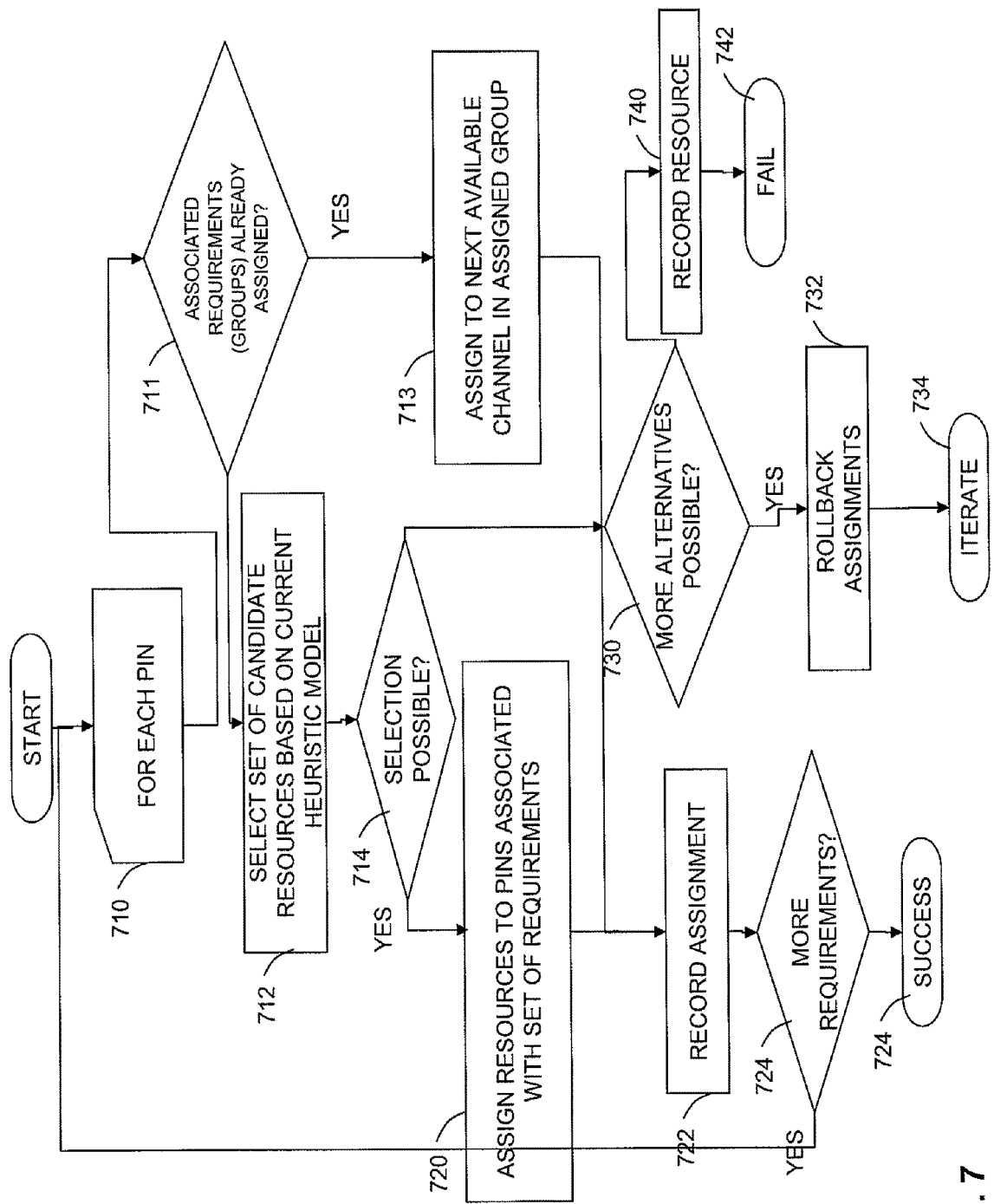
FIG. 7 is flow chart of a sub-process for attempting to identify a workable assignment for a candidate flow that may be iteratively performed as part of the process of FIG. 6.

Turning to FIG. 7, further details of sub-process 630 are illustrated. FIG. 7 illustrates processing that may be performed for making assignments to meet resource engine requirements identified for a specific one of the possible flows identified at block 214.

In the processing of FIG. 7, the pins are processed in turn. Accordingly, the process of FIG. 7 starts at block 710, representing the beginning of a loop that is repeated for each pin. In performing the loop that starts at block 710, the pins are processed in the ordered established at block 618.

From block 710, decision block 711. Processing branches at decision block 711, depending on whether the selected pin is part of a multi-pin group for which an assignment has already been made. If not, processing proceeds to block 712.

At block 712, for a pin being processed, a set of candidate resources is identified to meet the set requirements for the pin and other pins in its associated group. In the embodiment illustrated, a set of candidate resources is selected by identifying one or more available resource engines that meet the resource engine requirements of the set of pins. In this context, a resource engine is considered available if it has not been included as part of a candidate assignment. In some scenarios, a resource engine may have a capacity to be assigned to satisfy more than one resource engine requirement. In this scenario, a resource engine may also be available if it has not been assigned to meet resource engine requirements equal to its capacity. As a specific example, a resource engine may have a fan out capacity to drive multiple pins. If the resource engine has not yet been assigned to drive, during a test flow step, the total number of pins that it is capable of driving, the resource engine may be considered available such that it could be selected for assignment to satisfy a further resource engine requirement during that test flow step.

Though, even if a resource engine is available, it will only be selected at block 712 if it can satisfy the requirements of the set of requirements being processed. In the example in which a resource engine is available because it has not been assigned to the number of pins to which it is capable of fanning out, the resource engine may nonetheless not be selected because it cannot meet one or more requirements of the set of requirements. As one example, the resource engine may be assigned to a pin that would require the resource engine to operate in a different timing group than would be necessary to meet requirements of the set of requirement being processed at block 712. In this scenario, a resource engine may be disqualified as a candidate resource engine selected at block 712.

In some scenarios, there may be more than one available resource engine that meets a resource engine requirement of the set being processed. In this scenario, one of the candidate resource engines may be selected at block 712. The selection of a resource engine may be based on one or more heuristics or other criteria that facilitate arriving at a workable assignment for all sets of requirements. For example, if two types of resource engines can satisfy a resource engine requirement, a resource engine of the more available type may be selected. As an example of another heuristic, in an embodiment in which resource engines are being selected for concurrent testing of multiple sites, resource engines may be selected such that the same resource engine, if possible, be mapped to corresponding pins in each of the sites. As a specific example, if a resource engine can source signals associated with three differential pairs, but the set of requirements being processed requires a resource engine to source one differential pair, the resource engine that can source three differential pairs may be preferentially selected such that the same resource engine may be assigned to a corresponding pair of pins in each of the other sites. A corresponding heuristic applies for selecting resources for corresponding requirements associated with groups in other sites—namely, if a resource engine has been previously assigned to a corresponding group in another site, but still has available capacity, that resource engine will be preferentially selected. Ordering the groups of resource engine requirements to position corresponding groups of pins in different sites consecutively in the order facilitates application of such heuristics in which assignments to corresponding groups in each of multiple sites are considered in allocating resource engines to resource engine requirements.

Other heuristics or other criteria may be used in selecting from among multiple available resource engines that meet the resource engine requirement of a selected set of requirements.

As a further example, the smallest resource engine that meets the requirement may be selected. As an example of this heuristic, a resource engine requirement may be for a single digital pin. If a first available resource includes one unassigned digital pin and a second includes eight unassigned digital pins, the selection as block 712 will favor the resource engine that has one unassigned digital pin.

It should be appreciated that application of certain criteria may lead to conflicting selections. For example, a heuristic to select the smallest resource engine may conflict with a heuristic indicating selection of a resource engine to meet the requirements of corresponding groups in multiple sites. Accordingly, rules or other criteria may be used to determine an order of precedence for other selection criteria.

Regardless of the criteria used to select a resource engine at block 712, following the execution of block 712, the process may branch at decision block 714 based on whether a selection was possible at block 712. If a selection was possible, the process may branch to block 720 where test system resources associated with the selected resource engine may be assigned to pins of the group associated with the set of requirements being processed. A block 722 this assignment may be recorded as part of a developing candidate assignment of resources. The assignment may be recorded in any suitable way. For example, information identifying the assignment may be recorded in data structure in computer memory.

Information recorded at block 722 may be used to define a final assignment if all of the requirements of all of the sets are satisfied. Additionally, while the process of FIG. 7 is being performed, the recorded information may also be used to track available resource engines. Moreover, information stored at block 722 may include an identification of available resources that were not selected. As described below in connection with block 732, if a point in the process is reached where no resource engine can be found to satisfy a resource requirement, the processed may be "rolled back" to test whether a different selection of resources earlier in the process would result in a valid assignment.

Processing may also reach decision block 722 from decision block 711 by passing through block 713. This branch may be taken when a pin selected for processing is part of a group for which assignments have previously been made as part of processing another pin in the group. In this scenario, processing at block 713 results in the selected pin being assigned to the next available channel for that pin group. However, additional resources are not assigned in the embodiment illustrated.

From block 722 processing may proceed to decision block 724. At decision block 724, the process may branch based on whether all of the sets of requirements have been met. If more sets of requirements remain, the process loops back from decision 724 to block 710 where the next set of requirements is selected and processed to identify resource engines meeting that set of requirements. Conversely, if all sets of requirements have been satisfied by assignment of candidate resource engines, the process may end at termination point 724. If processing reaches termination point 724, sub-process 630 (FIG. 6) will end, indicating a successful assignment has been identified.

Conversely, if a selection of resource engines to meet a set of requirements is not possible at block 712, the process may branch at decision block 714 to decision block 730. At decision block 730, the process may again branch depending on whether there were available alternatives to any of the resource engines selected as a candidate resource engine that have not previously been selected as the candidate resource an assignment may be attempted based on selection of one of the alternative resource engines in place of the selected resource engine. Accordingly, in this scenario, processing may branch from decision block 730 to block 732. At block 732, the state of assignments recorded at block 722 may be rolled back to a state prior to selection of the candidate resource engine for which an alternative selection is to be tested.

The selected candidate resource to be replaced by an alternative, and therefore the point to which the process is to be rolled back, may be determined in any suitable way. In some embodiments, the most recently selected candidate resource for which untried alternative resource engines exist may be replaced. Alternatively, the first selected candidate resource engine for which untried alternatives exist may be selected and replaced. Though, any suitable technique may be used to identify a candidate resource to be replaced by an alternative selection. For example, the selection of a candidate resource engine to be replaced may be based on availability of resource engines at the time of the replacement. Though, other heuristics may be used to select a resource engine to be replaced. For example, the candidate resource engine to be replaced may be selected based on degree of fit between resource engines and the pins in a group to which they are assigned. Assignments that retain resource engines that fully meet the requirements of a group, without additional capacity to supply other pins, may be preferentially retained over assignments in which one resource engine does not fully meet the requirements of the group or for which an assigned resource engine has unused capacity. Alternatively or additionally, similar criteria may be applied to resource engine assignments in which a resource engine meets the requirements of corresponding pin groups in all of the sites.

Regardless of the manner in which a candidate resource engine is identified, the state of the assignment record as created at block 722 at the time prior to assignment of that candidate resource may be recreated. Any suitable technique for tracking the state of the assignments may be employed at block 722 and the specific processing used at block 732 to roll back the state of the assignment record may depend on the specific format in which the assignment records are stored. As a simple example, information recorded at block 722 may be recorded in frames, with each frame defining process state information, such as assignments already made, available resources and alternatives tried. Rolling back may entail deleting frames until an appropriate frame is found. Though, in other embodiments a rollback may be implemented using a stack with recursion.

Regardless of the manner in which a previously assigned resource is identified for replacement, once appropriate processing conditions are established, processing may proceed to termination point 734. From termination point 734, processing may jump back to block 712 where processing may resume based on selection of an alternative resource engine to attempt to form an assignment of resource engines to resource requirements.

Conversely, if no further alternative candidate resource engines to try exists or a termination condition has otherwise been reached, processing may branch from decision block 730 to block 740. At block 740, a record may be made of the resource engine requirement for which no selection of a candidate resource engine was possible. This information may be used as part of outputs 370, such as in outputs 382 indicating limitations of the target tester configuration that precluded an assignment from being made.

The process may then proceed to termination point 742. At termination point 742, the process of FIG. 7 may end, resulting in sub-process 630 ending in a failure condition. In this scenario, the process of FIG. 6 may branch at decision block 640 along the failure path to decision block 641, where the process may repeat with a different weighting, or to decision block 642, where the process may repeat with a different possible flow or other suitable processing. Processing may iterate in this fashion until a successful assignment of resource engines to resource engine requirement is identified or assignments are attempted for each possible flow and no valid assignment could be identified.

Though, it should be recognized that other termination conditions may be possible. For example, the processing of combined FIGS. 6 and 7 may be terminated after a preset period of time. Likewise, any portion of the processing of FIGS. 6 and 7 may be terminated after a predetermined period of time. As an example, processing at decision block 730 may branch to block 740 even if untried available resource engines meet requirements of the set after a predetermined number of attempts to try alternatives or a predetermined amount of processing time.

Figure 9:
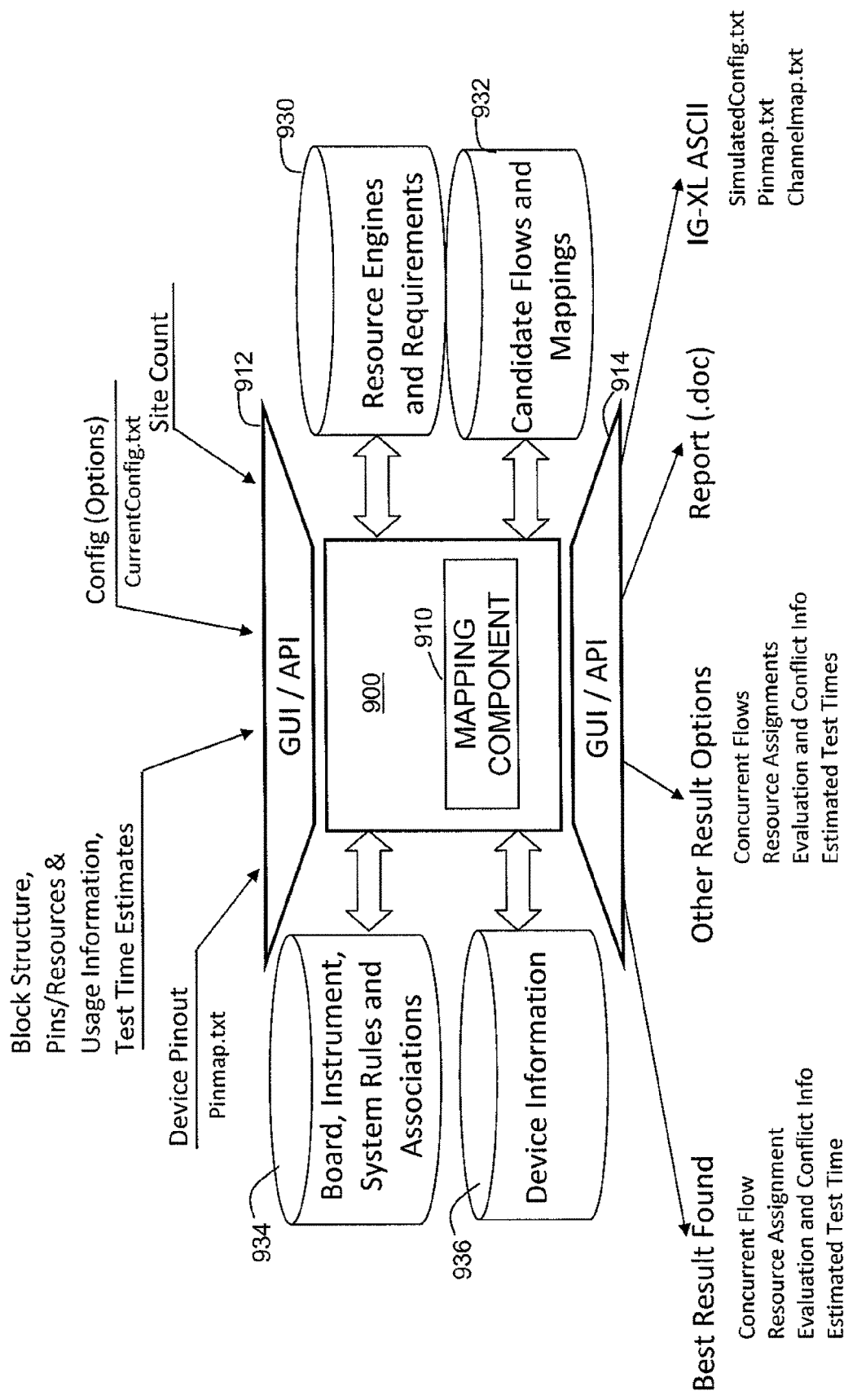
FIG. 9 is a schematic illustration of an implementation in a computer system of a tool according to some embodiments of the invention.

Turning to FIG. 9, a computer system implementing a tool according to some embodiments of the invention is schematically illustrated. The computer system implementing the tool may contain hardware components as are known in the art. For example, one or more processors and input/output devices may be provided as part of such a computer system. Additionally, computer storage media may be provided to store data processes or generated by the tool.

In the embodiment illustrated, tool 900 may be implemented as computer executable instructions prepared in any suitable computer language that may be executed on one or more of the processors. Those computer executable instructions may include a mapping component 910 that identifies whether a mapping can be established between test pins for a device under test and channels of a test system that supports a concurrent test plan. Mapping component 910 may implement processes such as described above in connection with FIGS. 6 and 7 to both determine whether a valid mapping exists, and, if so, to determine that mapping.

Operation of mapping component 910 may be based on inputs provided through an interface component 912. Interface component 912 may receive inputs from one or more sources and may be implemented as a graphical user interface for receiving inputs from a user of a computer system on which tool 900 is executing. Alternatively or additionally, interface component 912 may include one or more application programming interfaces (APIs) to allow tool 900 to receive inputs from other computerized tools used in designing a device or test process.

FIG. 9 provides examples of the types of data that might be input through interface component 912. For example, a device pinout may be provided to specify the pins of a device. The pinout may be entered manually by a user through a graphical user interface. Though, in some embodiments, the pinout may be input by providing a file or identifier of a file through an application programming interface. In this example, the device pinout may be encoded in a file entitled "Pinmap.txt."

Information relating to a configuration of a target tester may similarly be provided through a graphical user interface or an application programming interface. In this example, the target tester configuration may be encoded in a file entitled "CurrentConFIG.txt." Other inputs such as inputs 310 (FIG. 3) may similarly be input through interface component 912. These values similarly may be entered through a graphical user interface or an API.

Interface component 914 provides an output mechanism for tool 900. Any suitable data may be output through interface component 914, including any of the outputs 370 (FIG. 3). This information may be output through a graphical user interface, such as by displaying the information on a computer screen or printout on a device connected to the computer on which tool 900 executes. Alternatively or additionally, the information may be output through an application programming interface that may record the information in a file or other suitable data structure that may be accessed by other computerized systems or may be passed directly to another computerized tool through an API within interface component 914. As an example of information passed through an API, FIG. 9 shows that tool 900 may generate multiple files that may be used in creating a test environment for testing devices as the devices are being manufactured according to an identified concurrent test plan. This information may be recorded in a format used by a test development environment, such as IG-XL™ test development environment. In the example of FIG. 9, files such as "SimulatedConFIG.txt" and "Pinmap.txt" and "Channelmap.txt" may be generated in XML or other suitable language that may be accessed by a test development environment tool.

The results of the execution of the tool may be captured in a document in a human readable and editable format, such as the document "report (.doc)" illustrated in FIG. 9. This report may contain any information generated by tool 900, such as flows that were attempted, resources that were not available to complete a mapping for a particular flow, projected test execution times associated with flows for which mappings could be created or any other information that may be generated.

In the example of FIG. 9, interface component 914 may also output information through a graphical user interface to be reviewed by a user, instead of or in addition to storing the information in one or more files for later access either by the user or other computer implemented tools. The output of tool 900, for example, may include information describing the best result found by tool 900 or selected by the user from a set of candidate flows with successful resource assignment. The best result may be described based on the flow and resource assignment that was identified to achieve that flow. In conjunction with the best flow, tool 900 may provide the estimated test time for the identified flow.

Similar information may be output for other result options that may be identified other than the best result found. Such outputs may be provided in scenarios in which tool 900 repeats processing, such as the processing illustrated in FIG. 6, after a first result is identified. The first result may correlate with the best result found. By continuing processing to attempt to identify workable mappings for other flows, other results may also be identified.

FIG. 9 also illustrates that a computer system on which tool 900 executes may contain one or more data stores, holding information used by or generated by tool 900 as it executes. Data stores 930, 932, 934 and 936 are illustrated. In this example, data stores 930 and 932 may store data generated by the tool as it operates. Data stores 934 and 936 may store inputs to the tool. For example, data store 930 may store resource engine requirements such as may be identified based on processing at blocks 610 and 612. Data store 932 may store information on candidate mappings, such as may be recorded at blocks 722 or 744 and altered at block 732.

Data store 936 may store information relating to a device under test, test system or test program. Data store 934 may store rules and associations used in various stage of operation of tool 900. Data store 934, for example, may store rules for identifying available resources, selecting among available resources, forming groups of pins, making other selections or performing any other operations during execution of the tool.

Figure 10:
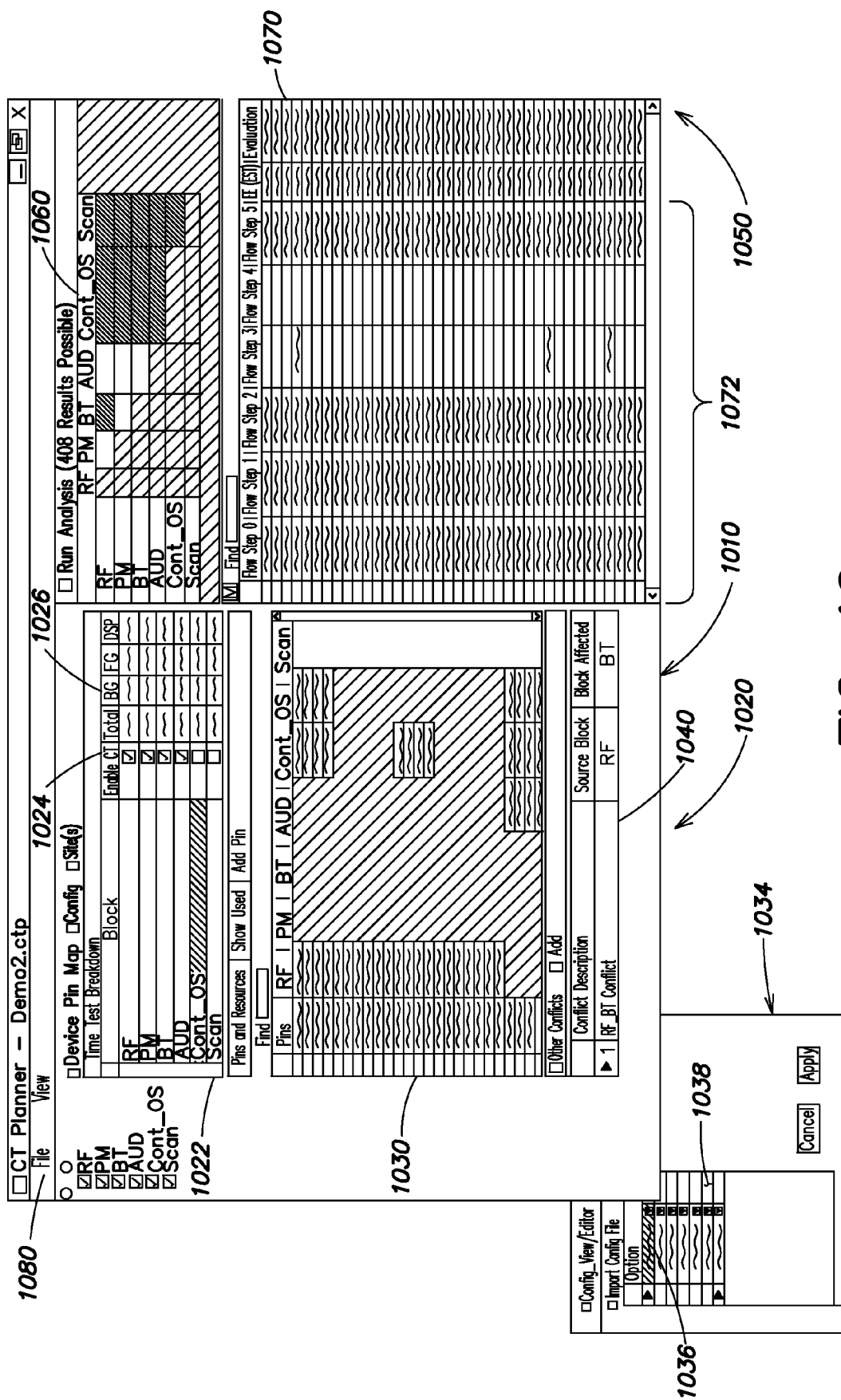
FIG. 10 is a sketch of an exemplary graphical user interface through which a user may provide values of parameters used in establishing a concurrent test plan according to some embodiments of the invention.

Turning now to FIG. 10, an example of a graphical user interface that may be implemented on a computer display by interface elements 912 and 914 is provided. Graphical user interface 1010 includes multiple display areas, some of which may be adapted for receiving user inputs and some of which may be adapted for providing outputs. Information may be input or output through graphical user interface 1010 using control elements of the type known in the art for implementing graphical user interfaces. These control elements may include columns, tables, drop-down lists, check boxes, sliders or display control objects of any suitable type.

In the example of FIG. 10, graphical user interface 1010 is generally divided to an input area 1020 and output area 1050. Input area 1020 may include multiple sub-areas, such as sub-area 1022 through which a user may enter information about test blocks. All of the information displayed in sub-area 1022 may be input by a user. Though, in some embodiments, information about test blocks may be initially obtained from a test generation program or other computerized resource. That information may be displayed in sub-area 1022 for the user to view and modify.

Additionally, display sub-area 1022 may include controls through which the user may specify specific test blocks to include in the concurrent test plan. In this example, for each test block identified, a check box style control is included to allow a user to specify whether the test block is to be included in the candidate flows from which a concurrent test plan is to be constructed.

Sub-area 1022 may also include fields providing information about each of the test blocks. These fields, for example, may identify an estimated test time or values of other parameters for the test block. In some scenarios, these fields may be editable controls such that user may, in addition to viewing the data, change the data, thereby changing inputs to tool 900 (FIG. 9).

Input area 1020 may further include a sub-area 1030 in which information about pins may be entered. For each pin associated with the device under test, resources used to generate or measure test signals at that pin during a test may be identified. In this example, sub-area 1030 is implemented as a grid, with each pin being represented as a line in the grid. Across each line, information about one or more types of resource that may be necessary to test the pin may be entered. As with sub-area 1022, the data in sub-area 1030 may be entirely entered by a user or may be obtained from another computerized tool used in developing a test program. These values may then be edited by a user.

A further sub-area 1034 may be displayed as part of graphical user interface 1010. In this example, sub-area 1034 provides information about a target tester configuration and a target number of sites. As with sub-areas 1022 and 1030, the information displayed in sub-area 1034 may be obtained from a file or output in any suitable form generated by another computerized tool used in developing a test program. This information may be displayed to the user and, at the user's option, modified. In this example, the tester configuration is displayed to the user as a table, with each row in the table relating to an instrument that may be present in a target test system configuration. In this example, a finite number of instruments types may be available for installation in a test system. The options for instrument type may be reflected in a drop down list 1036, such that a user may readily select configuration options. Each row of the table may further include a field 1038 in which a number of instruments of the designated type may be indicated. By manipulation of the drop down list control 1036 or entry of values in fields 1038, a user may readily modify a target test system configuration.

Other areas may be provided for the user to view or modify values of any parameter that may be used as an input by tool 900. Sub-area 1040 may allow a user to define, for example, conflicts. In this example, sub-area 1040 accepts input identifying blocks that cannot be tested together. This information may be used by tool 900, such as to filter candidate flows as discussed above in connection with block 214 (FIG. 2).

Information about conflicts may also be presented to the user. In the example of FIG. 10, output area 1050 includes a sub-area 1060 that provides a graphical representation of conflicts that have been identified. The conflicts depicted in sub-area 1060 may be based on the user inputs entered through sub-area 1040 and/or 1024, conflicts identified by operation of tool 900 or identified in any other suitable way. Though, when sub-area 1060 includes conflicts identified by multiple sources, the conflicts may be color coded or otherwise presented in a way that visually indicates the source of the conflict information. For example, different colors coding may be used to identify conflicts identified by a user which resulted in elimination of candidate test flows at block 214 (FIG. 2) and conflicts identified by operation of tool 900, which for example, may have been identified at decision block 640 (FIG. 6) during operation of tool 900. Such information may be useful in helping a test engineer identify changes to a target test system configuration or a test program that may lead to a more effective concurrent test program.

Sub-area 1070 may be used to output results of attempts to find valid resource assignments for the candidate test flows. In this example, the information is presented in a matrix. Each row in the matrix contains information about one candidate test flow and the results of an attempt to find a valid resource assignment for that flow. Though the information on candidate test flows may be presented in any suitable way, in this example, the candidate test flows are defined in a series of columns 1072. Each of the columns in the series 1072 provides information about test blocks included for concurrent execution in each step of the flow.

Each of the rows, associated with a flow, may indicate results of an attempt to find a valid resource assignment for the flow. In scenarios in which a flow failed because there was no available resource of a particular type to meet a resource requirement, that resource type may be indicated. Any other suitable information about the flows and resource assignments made or attempted for the flow may alternatively or additionally be presented.

Graphical user interface 1010 may include other controls allowing a user to manipulate data associated with operation of tool 900. For example, control 1080 is a project menu control. By operating control 1080, a user may input commands causing the tool to save data manipulated by the user. For example, operation of the file control 1080 may cause the tool to store information in data store 934 and/or data store 936.

Figure 11:
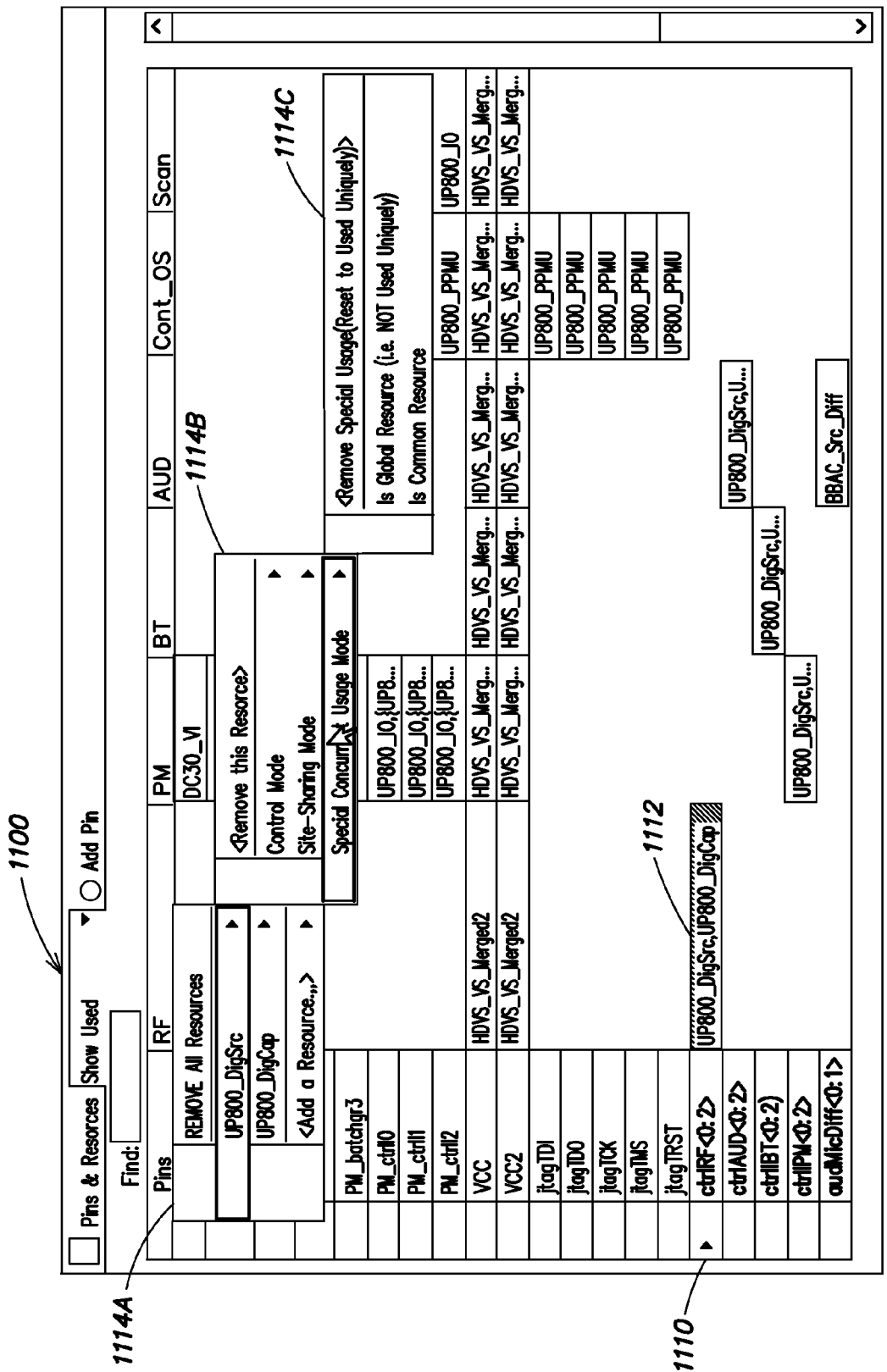
FIG. 11 is a sketch of an exemplary graphical user interface through which a user may input context sensitive special requirements according to some embodiments of the invention.

FIG. 11 provides an enlarged view of graphical user interface 1030, in an alternative operating state in which a user is interacting with the tool. Graphical user interface 1100 may be used to define requirements for pins or groups of associated pins. In this example, graphical user interface 1100 includes a display area formatted as a matrix. Each row of the matrix is associated with a pin or group of pins. Information across the row may specify requirements at a pin or pin group that may occur during each test block. In this example, the user has selected row 1110 such that the user may edit the requirements for the group of pins identified in row 1110. In this example, row 1110 is associated with a group of pins, which is identified by a name, "ctrlRF<0:2>." Specifically in this example, the user has selected a field in row 1110 associated with a test block, identified as "RF." The data entered in the selected field 1112 identifies requirements, by instrument type, for the identified group of pins during the identified test block. In this example, the data in field 1112 indicates that the user has specified two types of resources as being required.

Additionally, FIG. 11 illustrates that a user has accessed a series of drop down lists, 1114A, 1114B and 1114C. These lists specify additional requirements on the resource requirements specified in field 1112. As a specific example, drop down list 1114A allows a user to add a further resource in the field 1112 or to specify characteristics of a resource already specified in that field. In this case, the user has selected to specify characteristics of the resource requirement identified as UP800_DigSrc.

In list 1114B, the user may opt to remove the designation of the resource as required or may specify special overlay requirements for that resource. In this scenario, the user is presented with options to specify operating modes of the designated resource. Specifically in this example, the user has selected through list 1114B to include as part of the requirements in field 1112B that the resource operate in a special concurrent usage mode.

Through drop down list 1114C, the user may specify further characteristics of the special common usage mode of the designated resource. These drop down lists 1114A, 1114B and 1114C may be populated with information stored in data store 934, defining a target test system configuration, which defines the set of resources available and information about the instruments, which defines the nature of the resources and parameters about them that a user may specify. Though, such displays may be created in any suitable way.

Figure 12:
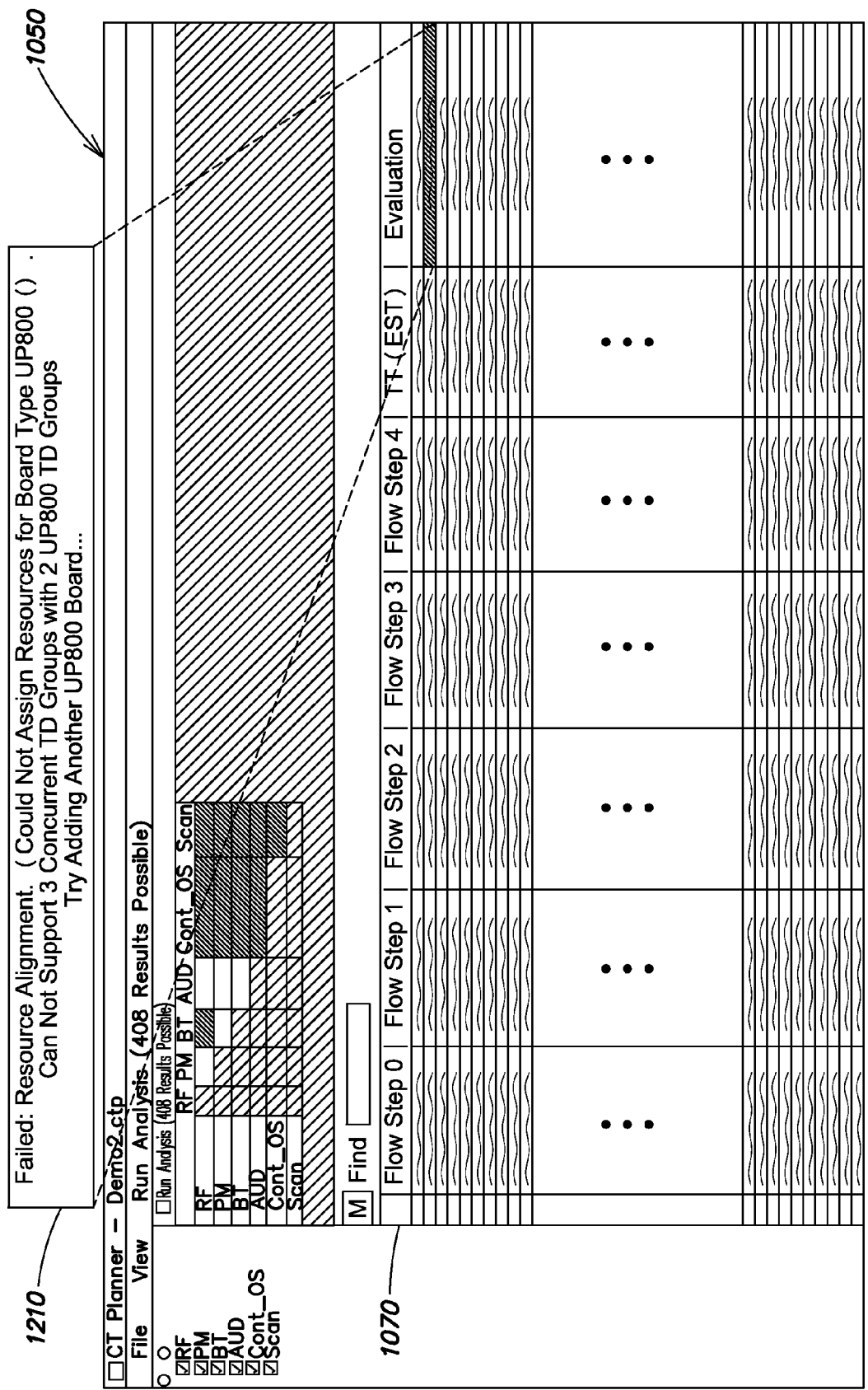
FIG. 12 is a sketch of an exemplary graphical user interface through which a user may receive outputs from a tool used in forming a concurrent test plan according to some embodiments of the invention.

FIG. 12 shows an enlarged view of sub-area 1070. FIG. 12 illustrates a message 1210 that appears for a flow illustrated in sub-area 1070. In this example, the message 1210 provides feedback to a user for why a valid resource assignment could not be found for a flow. Accordingly, in addition to indicating that an attempted assignment failed, message 1210 provides a reason why the attempted assignment failed. In this case, the attempted assignment failed because of a resource alignment. Furthermore, tool 900 may be programmed to suggest counter measures that may avoid failure of a specific flow. In this case, the tool has provided a suggestion to add an instrument containing the type of resource that was unavailable during an attempted resource assignment for the flow. Accordingly, FIG. 12 provides an example of feedback that may allow a user to iteratively apply the tool, in each iteration gaining insights into characteristics of an efficient concurrent test plan, modifying inputs to the tool and testing whether an improved concurrent test plan is achieved.

Figure 13:
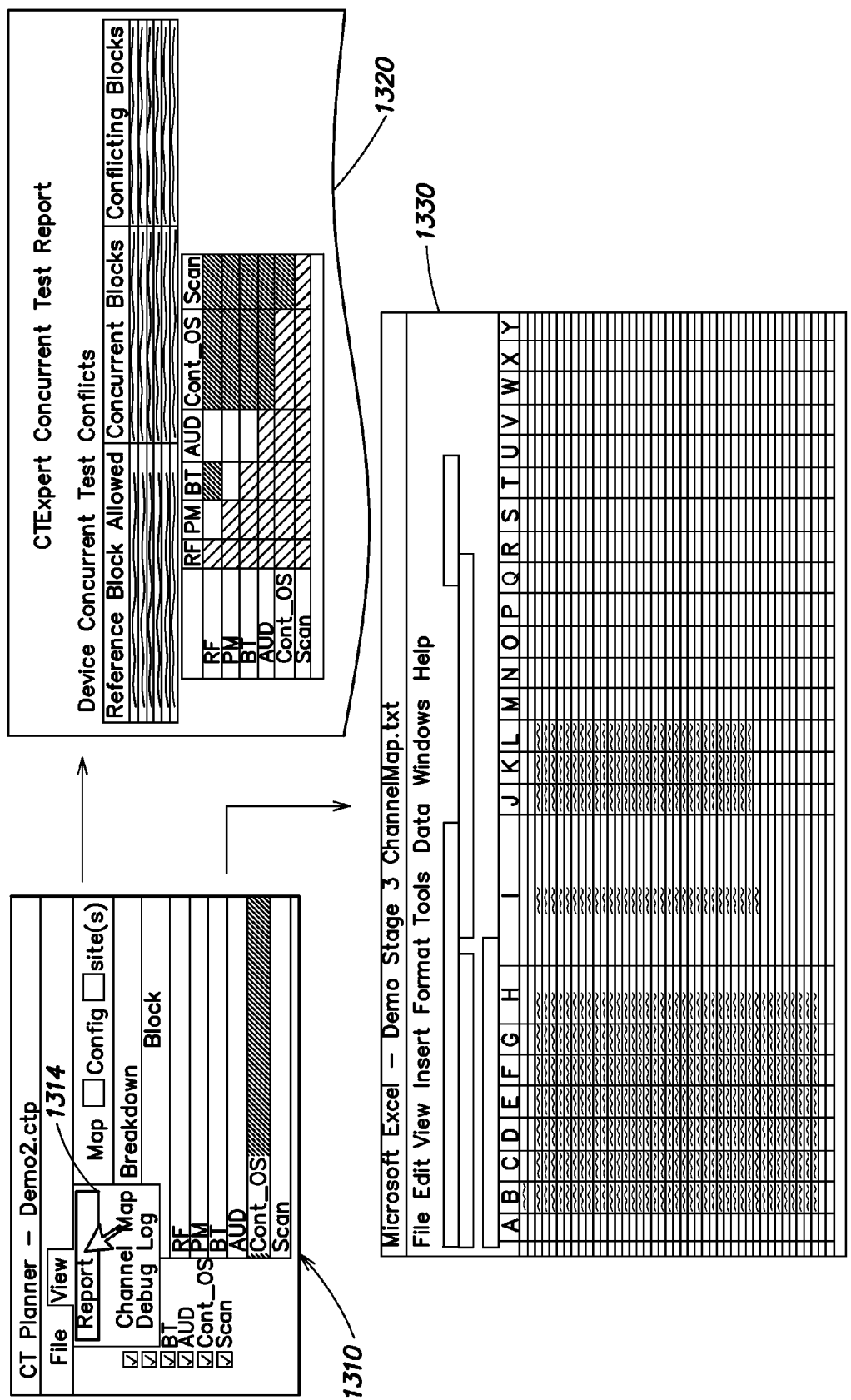
FIG. 13 is a sketch of an exemplary graphical user interface through which a user may receive output of a tool according to some embodiments of the invention.

FIG. 13 illustrates a graphical user interface through which a user may input commands to cause tool 900 to produce one or more outputs. Graphical user interface 1310 includes a drop down menu control 314 through which a user may select and output format. Multiple output format options may be presented to the user. As one example, a user may specify a report output format. In response to such a selection, tool 900 may create a report 1320. In this example, report 1320 is formatted as a word document with embedded graphics providing information about the concurrent test plan. In this example, the generated report 1320 describes in tabular and pictorial form test blocks that can be concurrently executed and those that conflict such that they can not be concurrently executed. The same information is presented in graphical form, with allowed and conflicting combinations of test blocks illustrated by shading in a matrix. Though, it should be appreciated that a report in any suitable format may be generated by tool 900.

Additionally, drop down menu 1314 includes other output formats. One such alternative output format is a channel map. A channel map 1330 is illustrated. In this example, a channel map may be recorded as a spreadsheet indicating a correlation between device pins and test system channels. In a multi-site concurrent test plan a mapping for a device pin for each site may be provided. Channel map 1330 may be specified in a format as is known in the art, though any suitable format may be used.

Figure 14A:
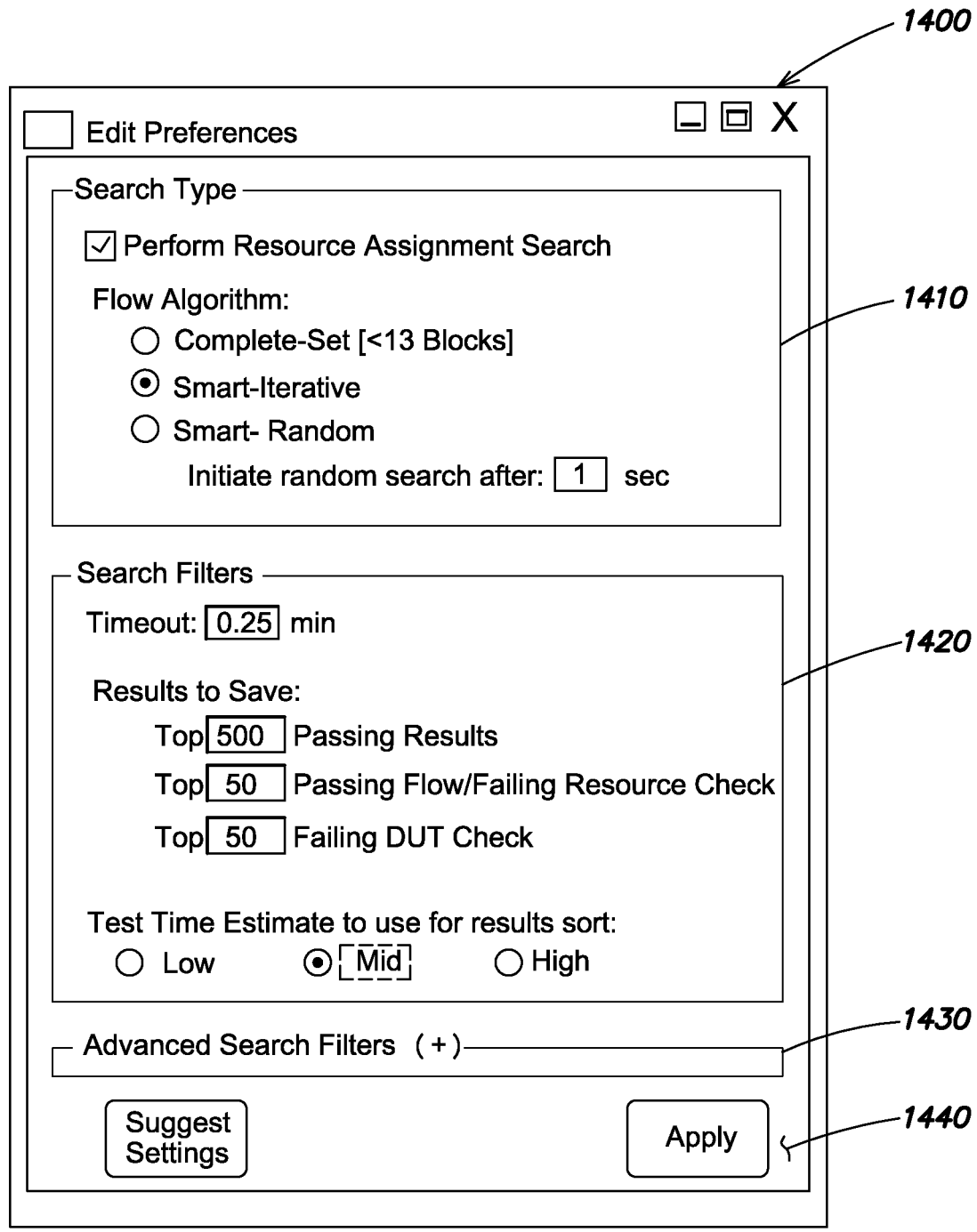

FIG. 14 illustrates a further graphical user interface 1400 that alternatively or additionally may be used to supply inputs to a tool 350. In this example, user interface 1400 includes multiple display areas through which a user may specify a desired operation of the tool.

Display area 1410 allows a user to input parameters that control the mode of operation of the tool. As described above, the tool may be used to attempt, for a specific device, test and test system configuration, identify an efficient flow for conducting the test. Though, other operating modes also may be supported, such as one in which the tool validates whether a resource mapping can be identified for a user supplied candidate flow. Input entered through display area 1410 may indicate the mode of operation.

In this example, the user has supplied input indicating that the tool is to operate in a mode in which it attempts to find a flow for which a valid resource assignment can be made. In this case, the tool may be configured to use one of multiple approaches for generating candidate flows. As described above, these may include a complete set algorithm, corresponding to processing in block 212 (FIG. 2). Alternatively, a user may select to have candidate flows generated by a flow iterator. In this case, the user may specify a type of iterator. Such options are illustrated in display area 1410, with Smart-Iterative candidate flow generation shown selected.

Display area 1410 also includes other input and information that may be used in configuring the tool. For example, a parameter may be specified as to how long the tool will execute before it reverts to Smart-Random mode. Also as illustrated, the tool may impose a limit on the number of blocks for which a complete search will be attempted. That limit is shown as 13 in this example, but it should be appreciated that the number of blocks, or even the existence of such a limit, is not a requirement of the invention.

Display area 1420 includes other input areas through which a user can input values for parameters that control how long the tool is likely to execute. These parameters may specify time out periods for overall execution of the tool or any phase of operation, such as how long the tool will execute before ending a search for a valid resource assignment for a candidate flow. Alternatively or additionally, values of parameters that impact operating time or output produced may also be specified. For example, these values may specify the number of valid assignments that are saved.

Display area 1430 provides a mechanism for a user to access further settings. Display area 1440 provides a mechanism for a user to activate controls that apply the settings or invoke other functions, such as having the tool suggest settings.

Figure 14B:
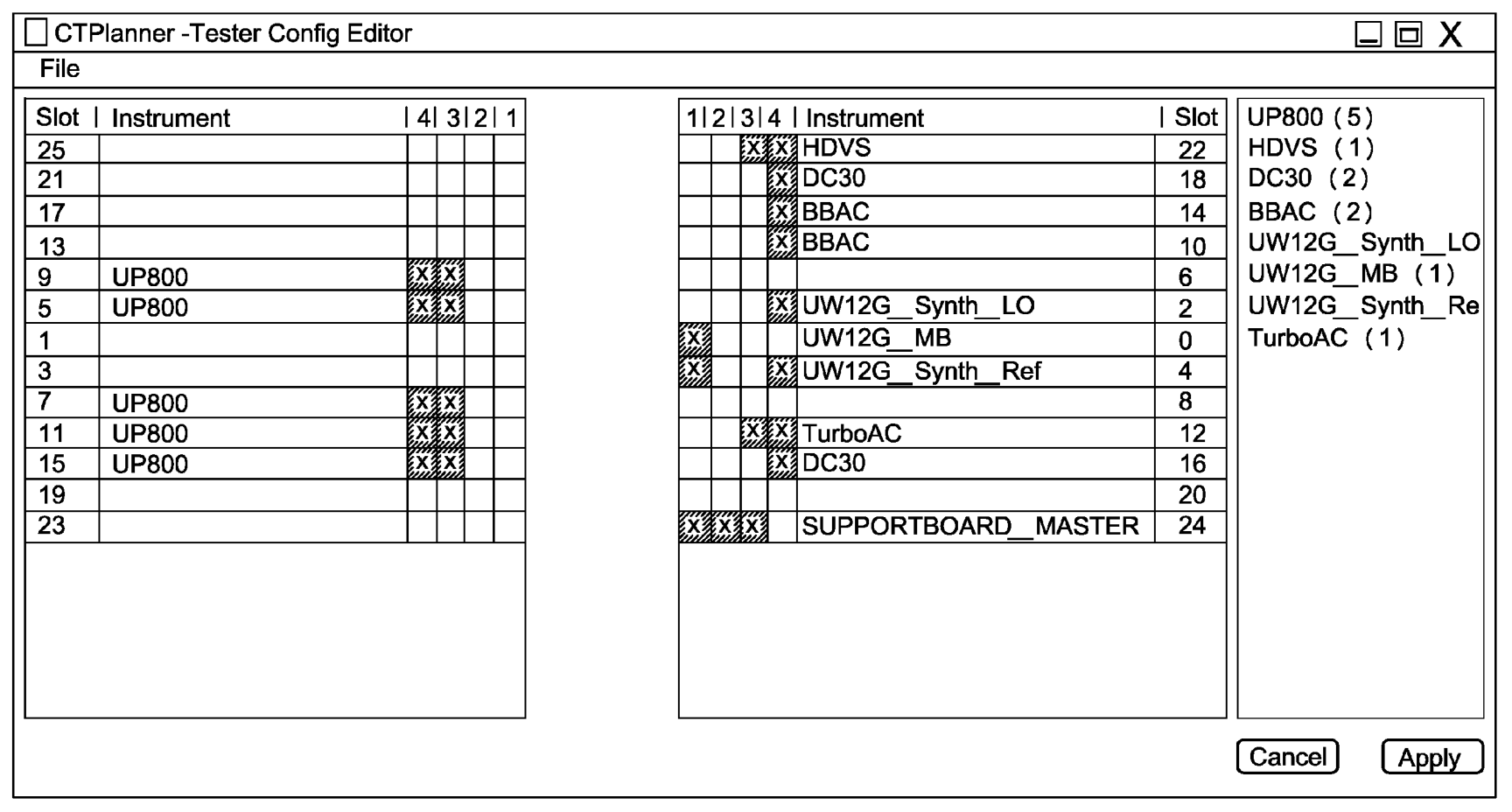

FIG. 14B illustrates a further user interface. In this example, the user interface of FIG. 14B provides a mechanism for a user to specify a test system configuration. This interface may be used instead of user interface 1034 (FIG. 10). Though, the interface of FIG. 14B includes a mechanism by which a user may specify a test slot into which each of the installed instruments is installed. A mapper that creates a map as described above may select instruments to route to specific pins based on the position of the instruments within a test system. Accordingly, this information may be supplied through the user interface of FIG. 14B.

Having thus described several aspects of at least one embodiment of this invention, it is to be appreciated that various alterations, modifications, and improvements will readily occur to those skilled in the art.

For example, FIG. 1 illustrates testing of devices as part of a wafer. The tool described above may be used in establishing a concurrent test plan regardless of the form of the device under test. In some embodiment, packaged parts may be tested and in other embodiments, multichip modules may be tested, for example. Testing devices in different forms may require different mechanical structures to implement mappings between test system resources and test pins, but such alternatives are also envisioned and may be made possible through the use of a tool as described herein.

Also, an interval during a test flow during which a resource engine is available may be a factor in making a resource engine assignment. In scenarios in which an assignment may change dynamically during a test flow, the same resource engine may be assigned to satisfy different requirements at different times during a flow. Such a change of assignments during a flown may be possible if the DIB or other portions of the test system include switches that can change physical connections between channels and pins. Alternatively, such a change of assignments may be possible with instruments in which the functionality of certain I/Os can be change. As a specific example, an instrument having I/Os connected to multiple channels may support one serial port, but at any one time that serial port functionality may be provided at any one channel to which the instrument is coupled. A resource engine representing this serial port functionality can be assigned, at different times, to different pins coupled to different channels associated with the instrument, so long as no two of those pins require serial port functionality at the same time during a flow. For determining whether temporal conflicts may exist, dynamic assignments may be for a test block or other suitable temporal interval of a flow. Multiple assignments of the same resource engine may be made so long as they do not result in violation of rules specifying the number of simultaneous connections permitted for a resource engine during any such interval.

Such alterations, modifications, and improvements are intended to be part of this disclosure, and are intended to be within the spirit and scope of the invention. Accordingly, the foregoing description and drawings are by way of example only.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Through, a processor may be implemented using circuitry in any suitable format.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including as a local area network or a wide area network, such as an enterprise network or the Internet. Such networks may be based on any suitable technology and may operate according to any suitable protocol and may include wireless networks, wired networks or fiber optic networks.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, the invention may be embodied as a computer readable medium (or multiple computer readable media) (e.g., a computer memory, one or more floppy discs, compact discs (CD), optical discs, digital video disks (DVD), magnetic tapes, flash memories, circuit configurations in Field Programmable Gate Arrays or other semiconductor devices, or other non-transitory, tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above. As used herein, the term "computer-readable storage medium" encompasses only a computer-readable medium that can be considered to be a manufacture (i.e., article of manufacture) or a machine.

The term's "program" or "software" are used herein in a generic sense to refer to any type of computer code or set of computer-executable instructions that can be employed to program a computer or other processor to implement various aspects of the present invention as discussed above. Additionally, it should be appreciated that according to one aspect of this embodiment, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that conveys relationship between the fields. However, any suitable mechanism may be used to establish a relationship between information in fields of a data structure, including through the use of pointers, tags or other mechanisms that establish relationship between data elements.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. As a specific example, FIG. 6 shows that blocks 610, 612 and 614, 616 and 618 occur within a loop that begins at block 600. In some embodiments, processing at some or all of blocks 610, 612 and 614, 616 and 618 may be independent of a specific candidate flow. In that scenario, some or all of blocks 610, 612 and 614, 616 and 618 may be performed before block 600.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A method of operating a computing device to generate information for a concurrent test plan for a device having a plurality of pins and to be performed by a test system having a plurality of resources, the method comprising:
   with at least one processor:
   a) for each group of a plurality of groups of pins, identifying a set of resource requirements, wherein the set of resource requirements comprises resources required for performing a test of the group of the plurality of groups;
   b) identifying a plurality of sets of test system resources, each of the plurality of sets comprising one or more test system resources that collectively meet a requirement; and
   c) matching sets of the plurality of sets of test system resources to respective groups of the plurality of groups.

2. The method of claim 1, wherein:
   the sets of the plurality of sets have an order; and
   the matching comprises assigning a group of the plurality of groups to each of the sets in the order until a group is assigned to each of the plurality of sets.

3. The method of claim 2, further comprising:
   d) assigning a score to each of the plurality of sets, the score indicating a degree of difficulty of matching resources to requirements of the set; and
   e) establishing the order of the plurality of sets based on the scores assigned to the plurality of sets.

4. The method of claim 1, wherein:
   the method further comprises:
   d) upon matching a group of the plurality of groups to a set of the plurality of sets, assigning resources in the set to pins in the group;
   the sets of the plurality of sets have an order; and
   the matching comprises assigning a group of the plurality of groups to each of the sets in the order until a next set in the order is reached for which there is no unassigned resource meeting a requirement for the next set.

5. The method of claim 4, further comprising:
   e) when there is no unassigned resource meeting a requirement for the next set, repeating act c), matching at least one different group of the plurality of groups to a set that the precedes the next set in the order.

6. The method of claim 5, further comprising:
   f) repeating act e) until a group is assigned to each of the plurality of sets; and
   g) generating a mapping between pins and tester resources based on the assignments of tester resources to pins in the act d).

7. The method of claim 6, wherein:
   the test comprises a plurality of blocks; and
   the set of resource requirements associated with each group of pins comprises collective resource requirements for pins in the group during all blocks of the test.

8. The method of claim 6, wherein:
   the test comprises a plurality of blocks; and
   the set of resource requirements associated with each group of pins comprises collective resource requirements for pins in the group during a portion of the blocks of the test.

9. The method of claim 1, wherein:
   the method further comprises:
   d) identifying a plurality of possible test flows; and
   e) ordering the possible test flows based on projected test execution time;
   the act a) is performed for a first test flow;
   when test system resources cannot be assigned to all of the plurality of pins to meet the sets of requirements for all of the plurality of groups, repeating at least the act a) and c) for second test flow, the second test flow following the first test flow in the order.

10. A method of manufacturing a semiconductor device, the method comprising:
    generating a test plan according to the method of claim 1;
    testing devices as part of a manufacturing operation according to the generated test plan; and
    selecting at least one process step during the process of manufacturing the tested devices based at least in part on results of the tests.

11. At least one non-transitory computer storage medium comprising computer-executable instructions that, when executed by at least one computing device, implement a method of interacting with a user, the method comprising:
    a) for each group of a plurality of groups of pins, identifying a set of resource requirements, wherein the set of resource requirements comprises resources required for performing a test of the group of the plurality of groups;

b) identifying a plurality of sets of test system resources, each of the plurality of sets comprising one or more test system resources that collectively meet a requirement; and c) matching sets of the plurality of sets of test system resources to respective groups of the plurality of groups.

12. The at least one computer storage medium of claim 11, wherein:
identifying the plurality of groups of pins comprises identifying groups associated with blocks concurrently executing within a flow step of a candidate flow;
the method further comprises, when the plurality of sets are inadequate to match every group of the plurality of groups to a set, indicating that the candidate flow has failed.

13. The at least one computer storage medium of claim 12, wherein: the method further comprises receiving user input specifying the candidate flow.

14. The at least one computer storage medium of claim 13, wherein:
the method comprises iteratively repeating the acts a), b) and c) for each of a plurality of flow steps in the candidate flow until the candidate flow fails or each of the plurality of groups is matched to a respective set of the plurality of sets.

15. A method of operating a computing device to generate information for a plan for concurrent test of at least one device, each of the at least one devices having a plurality of pins, and the test being performed by a test system having a plurality of resources connectable to the plurality of pins, the concurrent test comprising a plurality of blocks, the method comprising:
with at least one processor, iteratively performing processing comprising:
identifying a candidate flow in accordance with a heuristic, the candidate flow scheduling blocks to avoid previously identified conflicts between blocks;
for the candidate flow:
attempting to allocate resources of the plurality of resources to pins of the plurality of pins to execute the concurrent test according to the candidate flow;
when the attempting to allocate results in a successful allocation of resources, computing the test time for executing the concurrent test using the candidate flow;
when an allocation of resources is not successful because of a conflict between test blocks, recording the conflict between conflicting test blocks so that candidate flows in subsequent iterations do not include the conflict.

16. The method of claim 15, wherein:
in a second iteration, identifying a candidate flow in accordance with the heuristic comprises randomly generating a candidate flow that has characteristics indicated by the heuristic to execute the concurrent test in a time shorter than a test time computed during a prior iteration for a prior candidate flow.

17. The method of claim 15, wherein:
identifying a candidate flow in accordance with the heuristic in each of a plurality of iterations comprises generating candidate flows in an order, predicted by the heuristic, to execute in successively longer times.

18. The method of claim 15, further comprising:
providing as an output an indication of a candidate flow for which an allocation of resources is successful.

19. The method of claim 18, further comprising:
selecting the output candidate flow from among a plurality of candidate flows for which an allocation of resources is successful, the output candidate flow being selected based on computed test times for the plurality of candidate flows.

20. The method of claim 15, wherein:
the method further comprises receiving input providing an execution time estimate for each of the plurality of test blocks; and
computing the test time for a candidate flow comprises computing the test time based on the execution time estimates.

21. The method of claim 15, wherein the conflict comprises a requirement for resources to concurrently test the conflicting test blocks that exceeds the resources of the test system.

22. The method of claim 15, wherein the conflict comprises a requirement for a pin of the device under test to operate in at least two of the conflicting test blocks.

23. The method of claim 15, further comprising:
receiving user input defining a new configuration of the test system; and
repeating the act of iteratively performing processing based on the new configuration.

24. The method of claim 23, wherein:
receiving the user input and repeating the act of iteratively performing processing occurs in real time.

25. The method of claim 24, wherein:
receiving user input defining a new configuration of the test system comprises receiving user input defining a number of sites for which the test system is configured.

26. The method of claim 15, further comprising:
prior to the act of iteratively performing processing, receiving input specifying conflicting test blocks, the input identifying blocks to which a same pin has been assigned.

27. The method of claim 15, further comprising:
receiving input specifying a termination condition for the act of iteratively performing processing.

28. The method of claim 27, wherein the termination condition is expressed as a time to iteratively perform processing, a maximum number of iterations in the iteratively performing processing or a target computed test time for executing a candidate flow.

29. At least one non-transitory computer-readable storage medium comprising a plurality of computer-executable instructions that, when executed by at least one processor, implement a tool for generating information for a plan for concurrent test of at least one device, each of the at least one devices having a plurality of pins, and the test being performed by a test system having a plurality of resources connectable to the plurality of pins, the concurrent test comprising a plurality of blocks, the computer-executable instructions comprising:
a plurality of modules, the plurality of modules comprising at least two modules selected from a group consisting of:
a first module for, in response to input designating a first technique, identifying at least one flow for concurrent test by:
enumerating candidate flows;
attempting to allocate resources of the plurality of resources to pins of the plurality of pins to execute the concurrent test according to each of the enumerated candidate flows; and
providing an output indicating a plurality of the enumerated candidate flows for which the allocation of resources is successful and a respective estimated test time for the enumerated candidate flow;

a second module for, in response to input designating a second technique, identifying at least one flow for concurrent test by:
iteratively generating, until a first termination condition is reached, a plurality of candidate flows by randomly generating, in each iteration, a candidate flow that has characteristics indicated by a heuristic to execute the concurrent test in a time shorter than a test time for a prior candidate flow computed during a prior iteration;
for each generated candidate flow, attempting to allocate resources of the plurality of resources to pins of the plurality of pins to execute the concurrent test according to each of the enumerated candidate flows;
providing an output indicating at least one of the generated candidate flows for which the allocation of resources is successful; and a third module for, in response to input designating a third technique, identifying at least one flow for concurrent test by:
iteratively generating, until a second termination condition is reached, a plurality of candidate flows by generating, in each iteration, a candidate flow that has characteristics indicated by a heuristic to execute the concurrent test in a time longer than a test time for a prior candidate flow computed during a prior iteration;
for each generated candidate flow, attempting to allocate resources of the plurality of resources to pins of the plurality of pins to execute the concurrent test according to each of the enumerated candidate flows;
providing an output indicating at least one of the generated candidate flows for which the allocation of resources is successful.

30. The at least one computer-readable storage medium of claim 29, wherein the computer-executable instructions comprise:
computer-executable instructions for receiving input specifying a candidate flow and determining whether resources of the plurality of resources can be successfully allocated to pins of the plurality of pins to execute the concurrent test according to the input candidate flow.

31. The at least one computer-readable storage medium of claim 29, wherein the computer-executable instructions comprise:
computer-executable instructions for receiving an input specifying the first termination condition or the second termination condition.

32. The at least one computer-readable storage medium of claim 29, wherein:
the computer-executable instructions comprise computer-executable instructions for receiving input specifying a maximum number of concurrent test blocks in each of the plurality of candidate flows generated by the second module or the third module.

33. The at least one computer-readable storage medium of claim 29, wherein:
the computer-executable instructions comprise computer-executable instructions for receiving input specifying a minimum number of flow steps in each of the plurality of candidate flows generated by the second module or the third module.

34. The at least one computer-readable storage medium of claim 29, wherein:
the computer-executable instructions comprise computer-executable instructions for receiving input specifying a pattern of test blocks to apply in the plurality of candidate flows generated by the second module or the third module.

35. The at least one computer-readable storage medium of claim 34, wherein:
the pattern of test blocks comprises test blocks for concurrent execution.

36. The at least one computer-readable storage medium of claim 34, wherein:
the pattern of test blocks comprises test blocks for sequential execution.

37. The at least one computer-readable storage medium of claim 34, wherein:
enumerating candidate flows comprises generating all possible unique test flows.

38. At least one non-transitory computer-readable storage medium comprising a plurality of computer-executable instructions that, when executed by at least one processor, implement a tool for generating information for a plan for a concurrent test of at least one device, each of the at least one devices having a plurality of pins, and the test being performed by a test system having a plurality of resources connectable to the plurality of pins, the concurrent test comprising a plurality of blocks, the computer-executable instructions for:
receiving input specifying a test system configuration;
receiving input specifying a candidate flow; and
determining whether resources of the plurality of resources can be successfully allocated to pins of the plurality of pins to execute the concurrent test according to the input candidate flow with the specified test system configuration.

39. The at least one computer-readable storage medium of claim 38, wherein:
receiving input specifying a test system configuration comprises receiving input specifying a number to test sites that the test system is configured to test.

40. The at least one computer-readable storage medium of claim 38, wherein:
receiving input specifying a test system configuration comprises receiving input specifying a quantity of a resource in the test system.

* * * * *

UNITED STATES PATENT AND TRADEMARK OFFICE
CERTIFICATE OF CORRECTION

PATENT NO. : 8,762,095 B2  
APPLICATION NO. : 13/100889  
DATED : June 24, 2014  
INVENTOR(S) : Van Wagenen et al.

Page 1 of 1

It is certified that error appears in the above-identified patent and that said Letters Patent is hereby corrected as shown below:

On the title page, Item [60] Related U.S. Application Data and in the Specification, Column 1, Line 7-8, "Provisional application No. 61/133,418, filed on May 5, 2010," should read --Provisional application No. 61/331,418, filed May 5, 2010--.

Signed and Sealed this  
Ninth Day of September, 2014

Michelle K. Lee  
*Deputy Director of the United States Patent and Trademark Office*